United States Patent
Son et al.

(10) Patent No.: US 10,559,580 B2
(45) Date of Patent: Feb. 11, 2020

(54) SEMICONDUCTOR MEMORY DEVICE

(71) Applicants: Yong-Hoon Son, Yongin-si (KR); Kyunghyun Kim, Seoul (KR); Byeongju Kim, Hwaseong-si (KR); Phil Ouk Nam, Suwon-si (KR); Kwangchul Park, Suwon-si (KR); Yeon-Sil Sohn, Yongin-si (KR); Jin-I Lee, Hwaseong-si (KR); Wonbong Jung, Seoul (KR)

(72) Inventors: Yong-Hoon Son, Yongin-si (KR); Kyunghyun Kim, Seoul (KR); Byeongju Kim, Hwaseong-si (KR); Phil Ouk Nam, Suwon-si (KR); Kwangchul Park, Suwon-si (KR); Yeon-Sil Sohn, Yongin-si (KR); Jin-I Lee, Hwaseong-si (KR); Wonbong Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 623 days.

(21) Appl. No.: 15/247,602

(22) Filed: Aug. 25, 2016

(65) Prior Publication Data

US 2017/0098656 A1    Apr. 6, 2017

(30) Foreign Application Priority Data

Oct. 1, 2015  (KR) .................. 10-2015-0138408

(51) Int. Cl.
*H01L 27/11568*   (2017.01)
*H01L 27/11565*   (2017.01)
*H01L 27/11582*   (2017.01)
*G11C 16/04*   (2006.01)

(52) U.S. Cl.
CPC .... *H01L 27/11568* (2013.01); *G11C 16/0466* (2013.01); *H01L 27/11565* (2013.01); *H01L 27/11582* (2013.01)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,455,940 B2 | 6/2013 | Lee et al. |
| 8,877,591 B2 | 11/2014 | Choe et al. |

(Continued)

*Primary Examiner* — Hoang-Quan T Ho
(74) *Attorney, Agent, or Firm* — Myers Bigel, P.A.

(57) ABSTRACT

A semiconductor memory device includes insulating patterns and gate patterns alternately stacked on a substrate, a channel structure that intersects the insulating patterns and the gate patterns and connected to the substrate, a charge storage structure between the channel structure and the gate patterns, and a contact structure on the substrate at a side of the insulating patterns and the gate patterns. One of the gate patterns includes a first barrier pattern between a first insulating pattern of the insulating patterns and a second insulating pattern of the insulating patterns adjacent the first insulating pattern in a first direction perpendicular to a main surface of the substrate, the first barrier pattern defining a concave region between a first portion of the first barrier pattern extending along the first insulating pattern and a second portion extending along the second insulating pattern, and a metal pattern in the concave region.

19 Claims, 41 Drawing Sheets

(56) References Cited

U.S. PATENT DOCUMENTS

| | | |
|---|---|---|
| 8,883,576 B2 | 11/2014 | Lee et al. |
| 8,884,357 B2 | 11/2014 | Wang et al. |
| 8,916,922 B2 * | 12/2014 | Jang .................. H01L 27/11565 |
| | | 257/324 |
| 8,946,807 B2 * | 2/2015 | Hopkins ........... H01L 29/42324 |
| | | 257/316 |
| 9,023,719 B2 | 5/2015 | Pachamuthu et al. |
| 9,048,138 B2 | 6/2015 | Moon et al. |
| 9,075,027 B2 | 7/2015 | Lange |
| 9,177,999 B2 | 11/2015 | Sasago et al. |
| 9,230,986 B2 * | 1/2016 | Hopkins ........... H01L 29/42324 |
| 9,799,671 B2 * | 10/2017 | Pachamuthu ......... H01L 21/768 |
| 2010/0155810 A1 * | 6/2010 | Kim .................. H01L 27/11548 |
| | | 257/316 |
| 2012/0064681 A1 * | 3/2012 | Kim .................. H01L 27/11565 |
| | | 438/264 |
| 2012/0098049 A1 * | 4/2012 | Moon ............... H01L 27/11556 |
| | | 257/324 |
| 2013/0161629 A1 | 6/2013 | Han et al. |
| 2014/0070300 A1 * | 3/2014 | Jang .................. H01L 27/11565 |
| | | 257/324 |
| 2014/0203344 A1 * | 7/2014 | Hopkins ........... H01L 29/42324 |
| | | 257/316 |
| 2015/0097155 A1 | 4/2015 | Bateman |
| 2015/0118811 A1 | 4/2015 | Makala et al. |
| 2016/0268264 A1 * | 9/2016 | Hwang ............ H01L 27/11578 |
| 2016/0343729 A1 * | 11/2016 | Shin .................. H01L 27/11582 |
| 2017/0125428 A1 * | 5/2017 | Kanamori ......... H01L 27/11519 |

* cited by examiner

SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2015-0138408, filed on Oct. 1, 2015, in the Korean Intellectual Property Office, the entire contents of which are hereby incorporated herein by reference.

BACKGROUND

The inventive concepts relate to semiconductor memory devices and, more particularly, to semiconductor memory devices with improved reliability.

Semiconductor devices have been highly integrated to provide high performance and low costs. The integration density of semiconductor devices may affect the costs of the semiconductor devices, thereby resulting in a demand of highly integrated semiconductor devices. An integration density of a conventional two-dimensional (2D) or planar semiconductor memory device may be mainly determined by an area occupied by a unit memory cell. Therefore, the integration density of the conventional 2D semiconductor memory device may be greatly affected by a technique of forming fine patterns. However, since extremely high-priced equipment may be used to form fine patterns, the integration density of 2D semiconductor memory devices continues to increase but is still limited.

Three-dimensional (3D) semiconductor memory devices including three-dimensionally arranged memory cells have been developed to overcome the above limitations. However, production of 3D semiconductor memory devices may be expensive as compared with 2D semiconductor memory devices and may have concerns regarding providing reliable device characteristics.

SUMMARY

Embodiments of the inventive concepts may provide semiconductor memory devices with improved reliability.

Embodiments of the inventive concepts may also provide methods of manufacturing semiconductor memory devices with improved reliability.

In an aspect of the inventive concepts, a semiconductor memory device may include a substrate, insulating patterns and gate patterns alternately stacked on the substrate, a channel structure that intersects the insulating patterns and the gate patterns and that is connected to the substrate, a charge storage structure that is between the channel structure and the gate patterns, and a contact structure that is on the substrate at a side of the insulating patterns and the gate patterns. At least one of the gate patterns may include a first barrier pattern that is between a first insulating pattern of the insulating patterns and a second insulating pattern of the insulating patterns that is adjacent the first insulating pattern in a first direction perpendicular to a main surface of the substrate, and defining a concave region that is between a first portion of the first barrier pattern that extends along the first insulating pattern and a second portion of the first barrier pattern that extends along the second insulating pattern, and a metal pattern that is in the concave region defined by the first barrier pattern.

In some embodiments, the at least one of the gate patterns may further include a second barrier pattern that is in the concave region defined by the first barrier pattern. The second barrier pattern may be between the metal pattern and the charge storage structure.

In some embodiments, the semiconductor memory device may further include blocking patterns between the charge storage structure and respective ones of the metal patterns. The blocking patterns may be spaced apart from each other by the insulating patterns in the first direction.

In some embodiments, the blocking patterns may surround a portion of an outer sidewall of the charge storage structure.

In some embodiments, a first thickness of a respective one of the metal patterns in the first direction may be smaller than a second thickness of a respective one of the blocking patterns in the first direction.

In some embodiments, the semiconductor memory device may further include an insulating layer that is between the charge storage structure and the gate patterns. The insulating layer may extend in the first direction.

In some embodiments, a sidewall of the metal pattern may be laterally recessed from a sidewall of the first insulating pattern and a sidewall of the second insulating pattern to define an undercut region. The charge storage structure may extend in the first direction, have a first segment between the channel structure and the metal pattern, and have second segments between the channel structure and the insulating patterns. A portion of the first segment of the charge storage structure may be in the undercut region.

In some embodiments, the channel structure may include a portion that protrudes toward the metal pattern.

In some embodiments, the metal pattern may be a first metal pattern and the semiconductor memory device may further include second metal patterns and an insulating layer. The second metal patterns may be between the contact structure and respective first barrier patterns of the gate patterns. The second metal patterns may be spaced apart from each other in the first direction with one of the insulating patterns interposed between adjacent second metal patterns. The insulating layer may be between the first barrier patterns of the gate patterns and the second metal patterns and may extend onto a top surface and a bottom surface of respective ones of the second metal patterns.

In some embodiments, the semiconductor memory device may further include residual insulating patterns between the contact structure and respective first barrier patterns of the gate patterns and spaced apart from each other in the first direction with one of the insulating patterns interposed between adjacent residual insulating patterns.

In some embodiments, a sidewall of at least one of the insulating patterns may be in contact with the contact structure, and a sidewall of at least one of the residual insulating patterns may be in contact with the contact structure.

In some embodiments, the metal pattern may be a first metal pattern and the at least one of the gate patterns may further include a second metal pattern that is between the first barrier pattern and the contact structure. One of the insulating patterns may be interposed between adjacent ones of the second metal patterns.

In an aspect of the inventive concepts, a semiconductor memory device may include a substrate, a first gate pattern on the substrate, second gate patterns that are sequentially stacked on the first gate pattern, a semiconductor structure that is on the substrate and intersecting the first gate pattern, a channel structure intersecting the second gate patterns and connected to the semiconductor structure, a charge storage structure that is between the channel structure and the second gate patterns, metal patterns disposed on sidewalls of the second gate patterns and spaced apart from each other in a first direction perpendicular to a main surface of the substrate, and an insulating layer that is between the second gate patterns and the metal patterns and extending onto a top surface and a bottom surface of respective ones of the plurality of metal patterns.

In some embodiments, the semiconductor memory device may further include barrier patterns between the charge storage structure and the second gate patterns, and blocking patterns between the charge storage structure and the barrier patterns. Respective ones of the blocking patterns may be spaced apart from each other in the first direction. Respective ones of the barrier patterns may be spaced apart from each other in the first direction.

In some embodiments, the semiconductor memory device may further include barrier patterns between the insulating layer and respective ones of the second gate patterns. Respective ones of the barrier patterns may extend onto a top surface and a bottom surface of the respective ones of the second gate patterns.

In an aspect of the inventive concepts, a semiconductor memory device may include a substrate, a charge storage structure that is on the substrate and that extends in a first direction perpendicular to a main surface of the substrate, a contact structure that is on the substrate and that extends in the first direction, a plurality of insulating patterns that are stacked on the substrate in the first direction and that are between the charge storage structure and the contact structure in a second direction parallel to the main surface of the substrate, a gate pattern that is on the substrate and that is between a first insulating pattern and a second insulating pattern of the plurality of insulating patterns that are adjacent one another in the first direction, and a blocking pattern that is on the substrate and between the first insulating pattern and the second insulating pattern in the first direction, and that is between the gate pattern and the charge storage structure in the second direction. The gate pattern may include a first metal pattern and an outer barrier pattern that is between the first metal pattern and the blocking pattern in the second direction.

In some embodiments, the semiconductor memory device may further include an inner barrier pattern comprising a first portion that is between the first metal pattern and the first insulating pattern, a second portion that is between the first metal pattern and the second insulating pattern, and a third portion that is between the first metal pattern and the contact structure.

In some embodiments, the semiconductor memory device may further include a residual insulating pattern between the third portion of the inner barrier pattern and the contact structure in the second direction.

In some embodiments, the semiconductor memory device may further include a second metal pattern that is between the inner barrier pattern and the contact structure in the second direction, and an insulating layer between the inner barrier pattern and the second metal pattern in the second direction.

In some embodiments, the contact structure may include a metal common source contact that extends in the first direction and contacts a doped portion of the substrate, and a spacer comprising an insulating material that extends in the first direction and contacts the second metal pattern.

BRIEF DESCRIPTION OF THE DRAWINGS

The inventive concepts will become more apparent in view of the attached drawings and accompanying detailed description.

DETAILED DESCRIPTION

Figure 1:
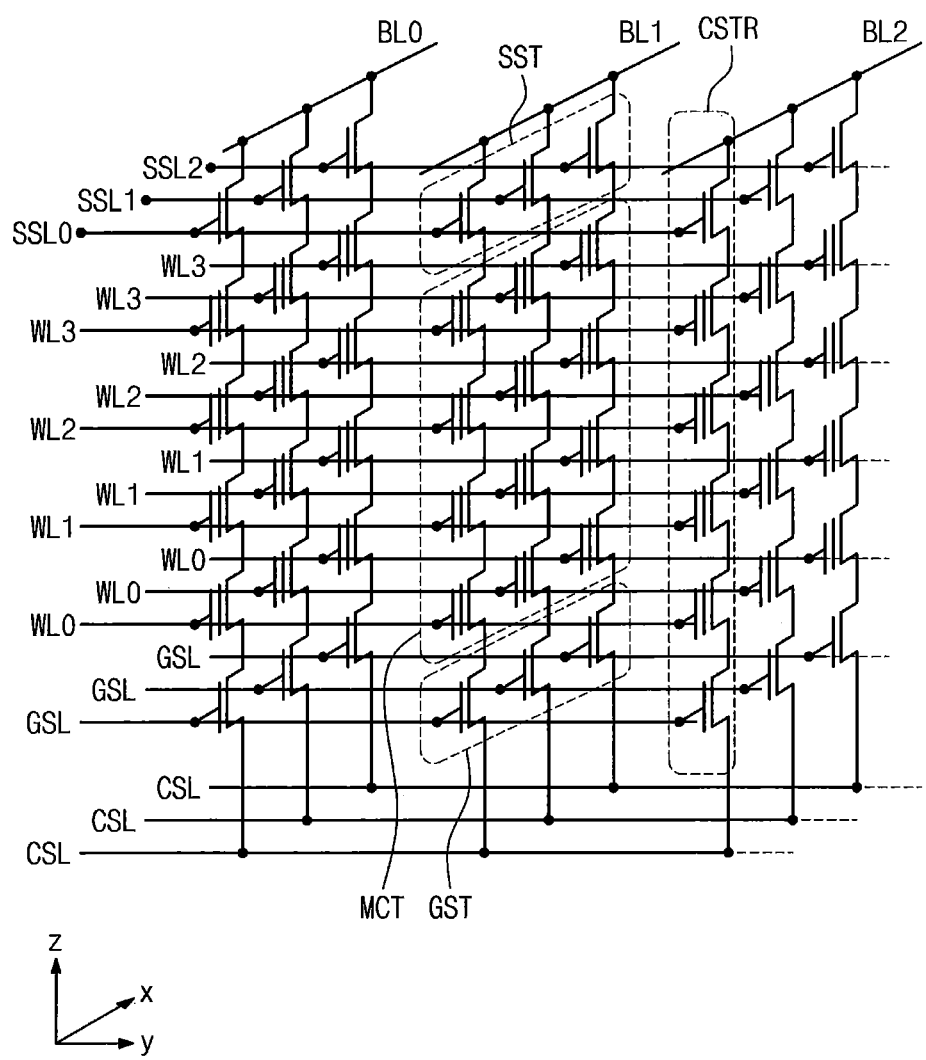
FIG. 1 is a schematic circuit diagram illustrating a cell array of a semiconductor memory device according to some embodiments of the inventive concepts.

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

As used herein, the singular terms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Example embodiments of aspects of the present inventive concepts explained and illustrated herein include their complementary counterparts. The same reference numerals or the same reference designators denote the same elements throughout the specification.

FIG. 1 is a schematic circuit diagram illustrating a cell array of a semiconductor memory device according to some embodiments of the inventive concepts.

Referring to FIG. 1, a cell array of a semiconductor memory device according to some embodiments of the inventive concepts may include a common source line CSL, a plurality of bit lines BL0 to BL2, and a plurality of cell strings CSTR disposed between the common source line CSL and the bit lines BL0 to BL2.

The common source line CSL may be a conductive layer disposed on a semiconductor substrate or a dopant region formed in the semiconductor substrate. The bit lines BL0 to BL2 may be conductive patterns (e.g., metal lines vertically spaced apart from the semiconductor substrate.) The bit lines BL0 to BL2 may be two-dimensionally arranged and a plurality of the cell strings CSTR may be connected in parallel to each of the bit lines BL0 to BL2. Thus, the cell strings CSTR may be two-dimensionally arranged on the common source line CSL or the semiconductor substrate when viewed from a plan view.

Each of the cell strings CSTR may include a ground selection transistor GST connected to the common source line CSL, a string selection transistor SST connected to one of the bit lines BL0 to BL2, and a plurality of memory cell transistors MCT interposed between the ground and string selection transistors GST and SST. The ground selection transistor GST, the memory cell transistors MCT, and the string selection transistor SST may be connected in series to each other in the order named. The common source line CSL may be provided in plurality. Ground selection lines GSL, a plurality of word lines WL0 to WL3, and string selection lines SSL0 to SSL2 which are disposed between the common source lines CSL and the bit lines BL0 to BL2 may be used as gate electrodes of the ground selection transistors GST, gate electrodes of the memory cell transistors MCT, and gate electrodes of the string selection transistors SST, respectively.

The ground selection transistors GST may be disposed at the substantially same level from the semiconductor substrate, and the gate electrodes thereof may be connected in common to the ground selection line GSL so as to be in an equivalent potential state. Thus, the ground selection line GSL may be disposed between the common source line CSL and the word line WL0 adjacent to the common source line CSL. Likewise, the gate electrodes of the memory cell transistors MCT disposed at the substantially same level from the common source line CSL may be connected in common to one of the word lines WL0 to WL3 so as to be in an equivalent potential state. Since one cell string CSTR includes the plurality of memory cell transistors MCT respectively disposed at different levels from each other, the plurality of word lines WL0 to WL3 may be disposed between the common source line CSL and the bit lines BL0 to BL2.

The ground and string selection transistors GST and SST and the memory cell transistors MCT may be MOS field effect transistors using a channel structure as channel regions. In certain embodiments, the channel structure and the lines GSL, WL0 to WL3, and SSL0 to SSL2 may constitute MOS capacitors. In these embodiments, the ground selection transistor GST, the memory cell transistors MCT, and the string selection transistor SST may be electrically connected to each other through inversion layers formed in the channel structure by fringe fields generated from the ground selection line GSL, the word lines WL0 to WL3, and one the string selection line SSL0 to SSL2.

It will be understood that though FIG. 1 illustrates three bit lines BL0 to BL2, embodiments of the inventive concepts may include more than three bit lines or less than three bit lines. Similarly, though four word lines WL0 to WL3 are illustrated corresponding to the plurality of memory cell transistors MCT in a given cell string CSTR, embodiments of the inventive concepts may include more than four word lines or less than four word lines. Similarly, some embodiments of the inventive concepts may include more ground selection transistors GST and/or string selection transistors SST than illustrated in FIG. 1 while still conveying the scope and spirit of the inventive concepts.

Figure 2:
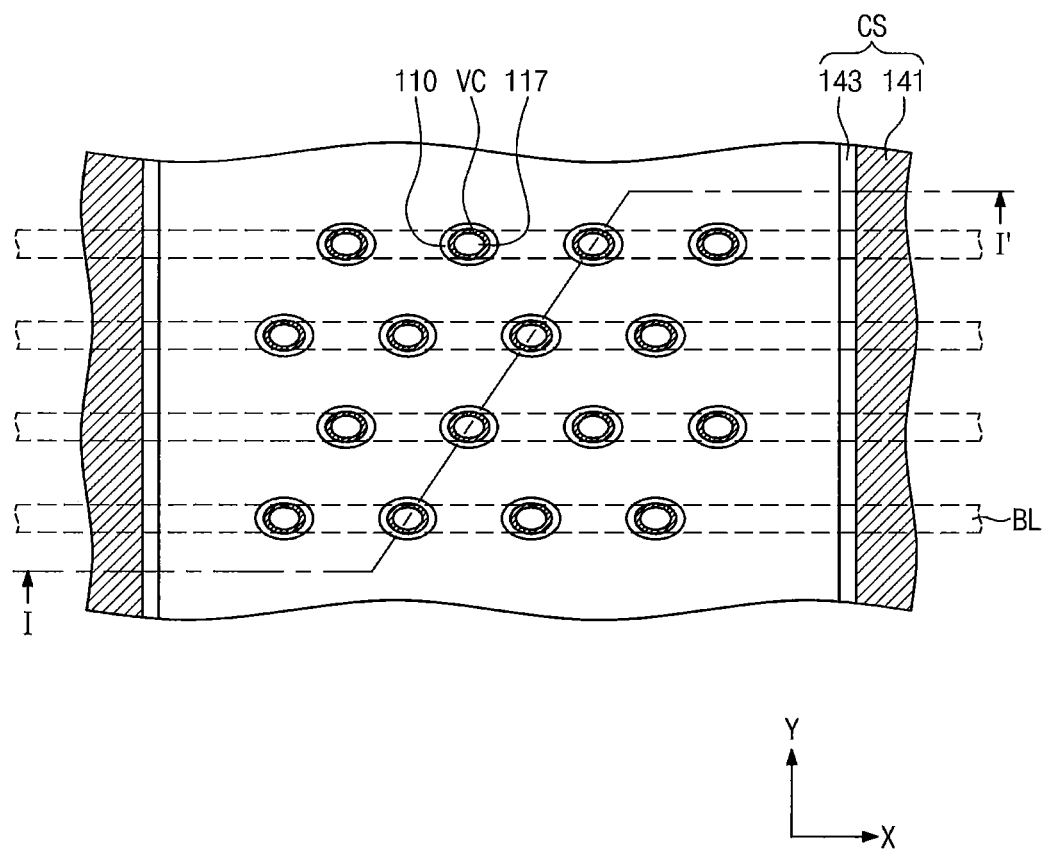
FIG. 2 is a plan view illustrating a semiconductor memory device according to some embodiments of the inventive concepts.
Figure 3:
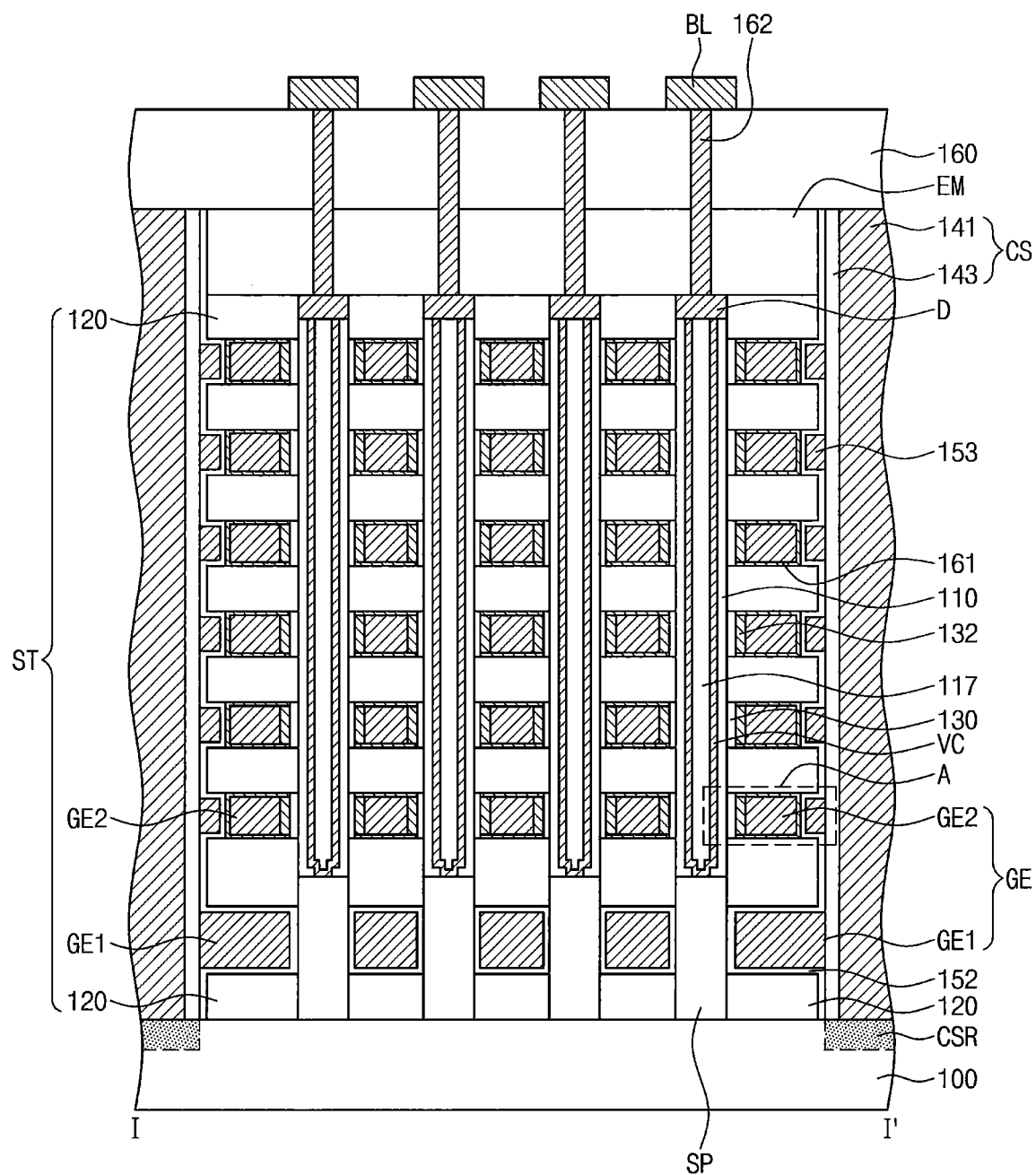
FIG. 3 is a cross-sectional view taken along a line I-I' of FIG. 2 to illustrate a semiconductor memory device according to some embodiments of the inventive concepts.
Figure 4:
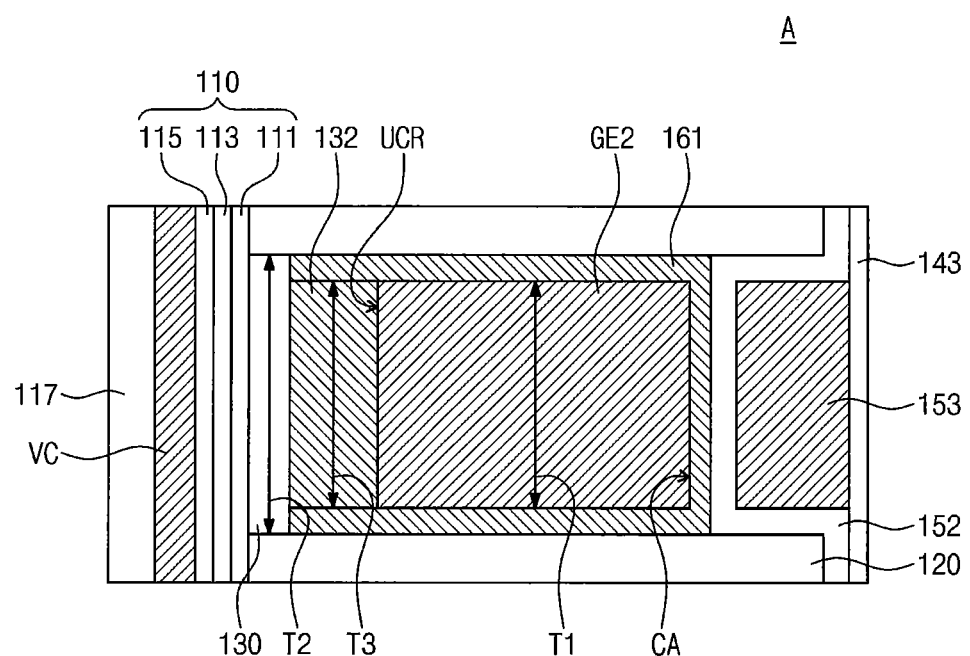
FIG. 4 is an enlarged view of a portion 'A' of FIG. 3.

FIG. 2 is a plan view illustrating a semiconductor memory device according to some embodiments of the inventive concepts. FIG. 3 is a cross-sectional view taken along a line I-I' of FIG. 2 to illustrate a semiconductor memory device according to some embodiments of the inventive concepts. FIG. 4 is an enlarged view of a portion 'A' of FIG. 3.

Referring to FIGS. 2 and 3, a stack structure ST may be disposed on a substrate 100. The stack structure ST may be provided in plurality, and the stack structures ST may be spaced apart from each other in a first direction X on the substrate 100 and may extend in a second direction Y perpendicular to the first direction X. In some embodiments, the first direction X may be parallel to a top, or main, surface of the substrate 100 and the second direction Y may be perpendicular to the top, or main, surface of the substrate 100. The substrate 100 may be a silicon substrate, a silicon-germanium substrate, a germanium substrate, or a single-crystalline epitaxial layer grown on a single-crystalline silicon substrate.

Dopant regions CSR may be disposed in the substrate 100 at both sides of the stack structure ST. The dopant regions CSR may extend in the second direction Y. In some embodiments, the dopant region CSR may correspond to the common source line CSL illustrated in FIG. 1. In these embodiments, the dopant region CSR may have a different conductivity type from the substrate 100.

The stack structure ST may include insulating patterns 120 stacked in a direction perpendicular to a top, or main, surface of the substrate 100, and gate electrodes GE disposed between the insulating patterns 120. For example, the insulating patterns 120 and the gate electrodes GE may be alternately and repeatedly stacked on the substrate 100. According to characteristics of the semiconductor memory device, one or some of the insulating patterns 120 may have a different thickness from another or others of the insulating patterns 120. For example, the insulating pattern 120 disposed between the lowermost gate electrode GE1 and the next lowermost gate electrode GE2 disposed on the lowermost gate electrode GE1 may be thicker than other insulating patterns 120. The insulating patterns 120 may include, for example, silicon oxide.

The gate electrodes GE may include a first gate electrode GE1 and second gate electrodes GE2. The first gate electrode GE1 may correspond to the lowermost one of the stacked gate electrodes GE. The second gate electrodes GE2 may be disposed on the first gate electrode GE1. The first gate electrode GE1 may be used as the ground selection line GSL of the ground selection transistor GST of FIG. 1. The second gate electrodes GE2 may be used as the word lines WL0 to WL2 of the memory cell transistors MCT of FIG. 1. In some embodiments, the uppermost one of the second gate electrodes GE2 may be used as the string selection line (e.g. SSL0 to SSL2) illustrated in FIG. 1. In certain embodiments, string selection lines (e.g. SSL0 to SSL2) laterally spaced apart from each other may be disposed on the uppermost one of the second gate electrodes GE2 of the stack structure ST, and all of the second gate electrodes GE2 may be used as word lines (e.g. WL0 to WL2).

As illustrated in FIG. 4, one sidewall of each of the second gate electrodes GE2 may be laterally recessed from sidewalls of the insulating patterns 120, and thus, an undercut region UCR may be defined between the insulating patterns 120 vertically adjacent to each other. The undercut region UCR may correspond to a space surrounded by the one sidewall of the second gate electrode GE2 and the insulating patterns 120 disposed on and under the second gate electrode GE2.

Vertical channel portions or structures VC may penetrate the stack structure ST. The vertical channel portions VC may be two-dimensionally arranged along the first and second directions X and Y when viewed from a plan view. The vertical channel portions VC constituting one column parallel to the second direction Y may be arranged in a line or a zigzag along the second direction Y when viewed from a plan view. The vertical channel portion VC may extend in the direction perpendicular to the top or main surface of the substrate 100 and may intersect sidewalls of the second gate electrodes GE2. The vertical channel portion VC may have a hollow pipe shape, a cylindrical shape, or a cup shape. The vertical channel portion VC may include a semiconductor material. For example, the vertical channel portion VC may include at least one of a poly-crystalline silicon layer, an organic semiconductor layer, or a carbon nanostructure.

A capping layer 117 may be disposed in an inner space surrounded by the vertical channel portion VC. The capping layer 117 may include an insulating material. For example, the capping layer 117 may include at least one of a silicon oxide layer, a silicon nitride layer, or a silicon oxynitride layer.

A pad D may be disposed on the vertical channel portion VC and the capping layer 117. The pad D may be electrically connected to the vertical channel portion VC. The pad D may include a conductive material or a semiconductor material doped with dopants having a different conductivity type from the vertical channel portion VC.

A semiconductor pillar or structure SP may be disposed between the vertical channel portion VC and the substrate 100. The semiconductor pillar SP may be disposed on the top surface of the substrate 100 and may penetrate the first gate electrode GE1. The vertical channel portion VC may be connected to the semiconductor pillar SP. The semiconductor pillar SP may be formed of a semiconductor material doped with dopants of the same conductivity type as the substrate 100 or may be formed of an intrinsic semiconductor material. For example, the semiconductor pillar SP may be formed of a single-crystalline intrinsic semiconductor material or a semiconductor material doped with P-type dopants.

A charge storage structure 110 may be disposed between the vertical channel portion VC and the stack structure ST. In some embodiments, the charge storage structure 110 may be disposed between the vertical channel portion VC and the second gate electrodes GE2 and may vertically extend along a sidewall of the vertical channel portion VC. The charge storage structure 110 may have a shape surrounding an outer sidewall of the vertical channel portion VC. As illustrated in FIG. 4, the charge storage structure 110 may include a blocking insulating layer 111, a charge storage layer 113, and a tunnel insulating layer 115. The blocking insulating layer 111 may be disposed between the vertical channel portion VC and the second gate electrodes GE2. The tunnel insulating layer 115 may be disposed between the blocking insulating layer 111 and the vertical channel portion VC. The charge storage layer 113 may be disposed between the blocking insulating layer 111 and the tunnel insulating layer 115.

The charge storage structure 110 may have a single-layered or multi-layered structure including at least one of a silicon oxide layer, a silicon nitride layer, a silicon oxynitride layer, or a high-k dielectric layer. For example, the blocking insulating layer 111 may include at least one of a silicon oxide layer or a high-k dielectric layer (e.g., an aluminum oxide ($Al_2O_3$) layer or a hafnium oxide ($HfO_2$) layer), the charge storage layer 113 may include a silicon nitride layer, and the tunnel insulating layer 115 may include at least one of a silicon oxide layer or a high-k dielectric layer (e.g., an aluminum oxide ($Al_2O_3$) layer or a hafnium oxide ($HfO_2$) layer).

A blocking pattern 130 may be disposed between the charge storage structure 110 and each of the second gate electrodes GE2. In detail, as illustrated in FIG. 4, the blocking pattern 130 may be disposed between the blocking insulating layer 111 and each of the second gate electrodes GE2. The blocking patterns 130 may be vertically spaced apart from each other. Each of the blocking patterns 130 may have a ring shape and may surround an outer sidewall of the blocking insulating layer 111. The blocking pattern 130 may be disposed in the undercut region UCR. A vertical thickness T2 of the blocking pattern 130 may be greater than a vertical thickness T1 of the second gate electrode GE2 (T2>T1). The blocking pattern 130 may correspond to a portion of a blocking insulating layer of a charge trap-type non-volatile memory transistor. For example, the blocking pattern 130 may include at least one of a silicon oxide ($SiO_2$) layer or a high-k dielectric layer (e.g., an aluminum oxide ($Al_2O_3$) layer or a hafnium oxide ($HfO_2$) layer).

An outer barrier pattern 132 may be disposed between the blocking pattern 130 and each of the second gate electrodes GE2. The outer barrier patterns 132 may be vertically spaced apart from each other. Each of the outer barrier patterns 132 may have a ring shape and may surround an outer sidewall of the blocking pattern 130. As illustrated in FIG. 4, the outer barrier pattern 132 may be disposed in the undercut region UCR. In some embodiments, the outer barrier pattern 132 and the second gate electrode GE2 may be defined as a gate pattern. Accordingly, the second gate electrode GE2 may be defined as a metal pattern.

A vertical thickness T3 of the outer barrier pattern 132 may be equal or similar to the vertical thickness T1 of the second gate electrode GE2 (T3=T1). In addition, the vertical thickness T3 of the outer barrier pattern 132 may be smaller than the vertical thickness T2 of the blocking pattern 130 (T3<T2). For example, the outer barrier pattern 132 may include a metal nitride such as titanium nitride (TiN), tantalum nitride (TaN), and/or tungsten nitride (WN).

A contact structure CS may be disposed between the stack structures ST adjacent to each other. In other words, the contact structures CS may be disposed at both sides of the stack structures ST. The contact structure CS may be connected to the dopant region CSR disposed in the substrate 100. The contact structure CS may extend along a sidewall of the stack structure ST in the direction perpendicular to the top surface of the substrate 100. In addition, the contact structure CS may intersect sidewalls of the gate electrodes GE, which are adjacent to the dopant region CSR. Furthermore, the contact structure CS may extend in the second direction Y along the dopant region CSR. Thus, the contact structure CS may have a rectangular shape or linear shape extending in the second direction Y when viewed from a plan view.

The contact structure CS may include a common source contact 141 and a spacer 143. The common source contact 141 may be connected to the dopant region CSR disposed in the substrate 100. For example, the common source contact 141 may include at least one of a metal material (e.g., tungsten, copper, or aluminum) and/or a transition metal (e.g., titanium or tantalum). The spacer 143 may be disposed between the common source contact 141 and the stack structure ST. For example, the spacer 143 may include an insulating material (e.g., a silicon oxide layer and/or a silicon nitride layer).

An additional metal pattern 153 may be disposed between the spacer 143 and each of the second gate electrodes GE2. The additional metal patterns 153 may be vertically spaced apart from each other. The spacer 143 may electrically insulate the common source contact 141 from the additional metal pattern 153. For example, the additional metal pattern 153 may include a metal material (e.g., tungsten (W)).

An insulating layer 152 may be disposed between the first gate electrode GE1 and the semiconductor pillar SP. The insulating layer 152 may extend onto a top surface and a bottom surface of the first gate electrode GE1. In addition, the insulating layer 152 may further extend between the spacer 143 and the insulating patterns 120, between the additional metal pattern 153 and the second gate electrode GE2, and between the additional metal pattern 153 and the insulating patterns 120. The insulating layer 152 may be disposed between the first gate electrode GE1 and the semiconductor pillar SP may be used as a gate insulating layer of the first gate electrode GE1. For example, the insulating layer 152 may include a silicon oxide layer.

An inner barrier pattern 161 may be disposed between the insulating layer 152 and each of the second gate electrodes GE2. The inner barrier patterns 161 may be vertically spaced apart from each other. Each of the inner barrier patterns 161 may extend onto top and bottom surfaces of each of the second gate electrodes GE2. Thus, the inner barrier patterns 161 may include a concave region CA that is defined to be concave or recessed toward the contact structure CS. The second gate electrode GE2 and the outer barrier pattern 132 may be disposed in the concave region CA of the inner barrier pattern 161. In other words, the inner barrier pattern 161 may extend onto the top and bottom surfaces of the second gate electrode GE2 and the top and bottom surfaces of the outer barrier pattern 132. In some embodiments, the inner barrier pattern 161 may form a U-shaped structure with an opening towards the charge storage structure 110. In some embodiments, the inner barrier pattern 161 may correspond to a portion of the gate pattern. In other words, the inner barrier pattern 161, the second gate electrode GE2, and the outer barrier pattern 132 may constitute the gate pattern. For example, the inner barrier pattern 161 may include a metal nitride such as TiN, TaN, and/or WN.

A mask pattern EM may be disposed on the stack structure ST. The mask pattern EM may cover a pad D. For example, the mask pattern EM may include silicon oxide and/or silicon nitride.

An interlayer insulating layer 160 may be disposed on the mask pattern EM. The interlayer insulating layer 160 may also cover the contact structure CS. The interlayer insulating layer 160 may include an insulating material (e.g., a silicon oxide layer, a silicon nitride layer, and/or a silicon oxynitride layer).

Contact plugs 162 may penetrate the interlayer insulating layer 160 and the mask pattern EM so as to be electrically connected to the pads D, respectively. The contact plugs 162 may include at least one of doped silicon or a metal material (e.g., tungsten (W), copper (Cu), or aluminum (Al)).

Bit lines BL may be disposed on the interlayer insulating layer 160. Each of the bit lines BL may intersect the stack structure ST and may be electrically connected to a plurality of the vertical channel portions VC arranged in the first direction X. The bit lines BL may include a conductive material (e.g., tungsten (W)).

Figure 5:
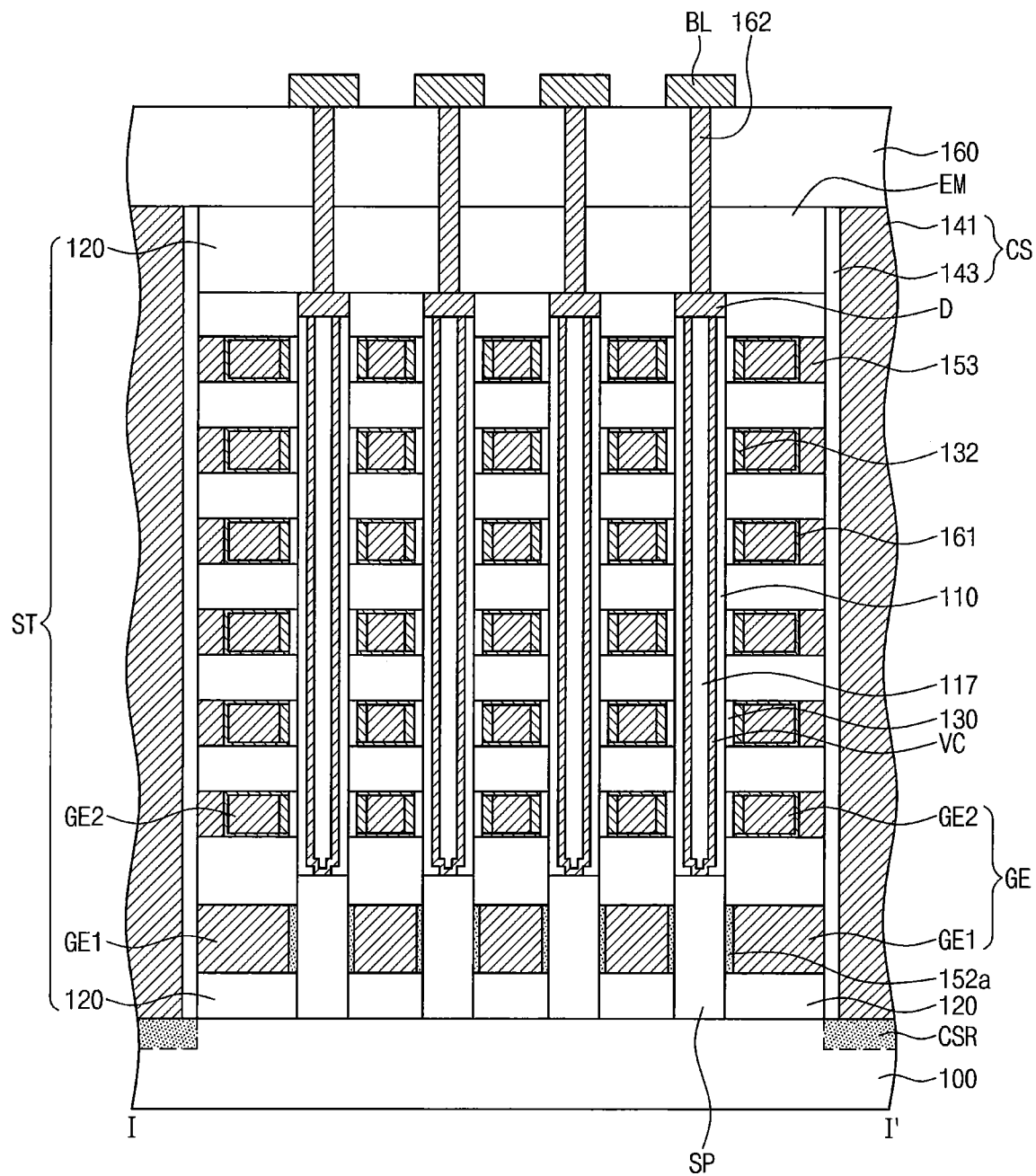
FIG. 5 is a cross-sectional view taken along the line I-I' of FIG. 2 to illustrate a semiconductor memory device according to some embodiments of the inventive concepts.

FIG. 5 is a cross-sectional view taken along the line I-I' of FIG. 2 to illustrate a semiconductor memory device according to some embodiments of the inventive concepts. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIG. 5, a gate insulating layer 152a may be disposed between the first gate electrode GE1 and the semiconductor pillar SP. The gate insulating layer 152a may include a thermal oxide layer. The first gate electrode GE1 may be in contact with the insulating patterns 120 which are disposed directly on and under the first gate electrode GE1.

The additional metal pattern 153 may be disposed between the inner barrier pattern 161 and the spacer 143. One sidewall of the additional metal pattern 153 may be in contact with the inner barrier pattern 161, and another sidewall of the additional metal pattern 153 may be in contact with the spacer 143. A top surface and a bottom surface of the additional metal pattern 153 may be in contact with the insulating patterns 120 disposed directly on and under the additional metal pattern 153, respectively. In some embodiments, the additional metal pattern 153 may correspond to a portion of the gate pattern including the second gate electrode GE2.

Figure 6:
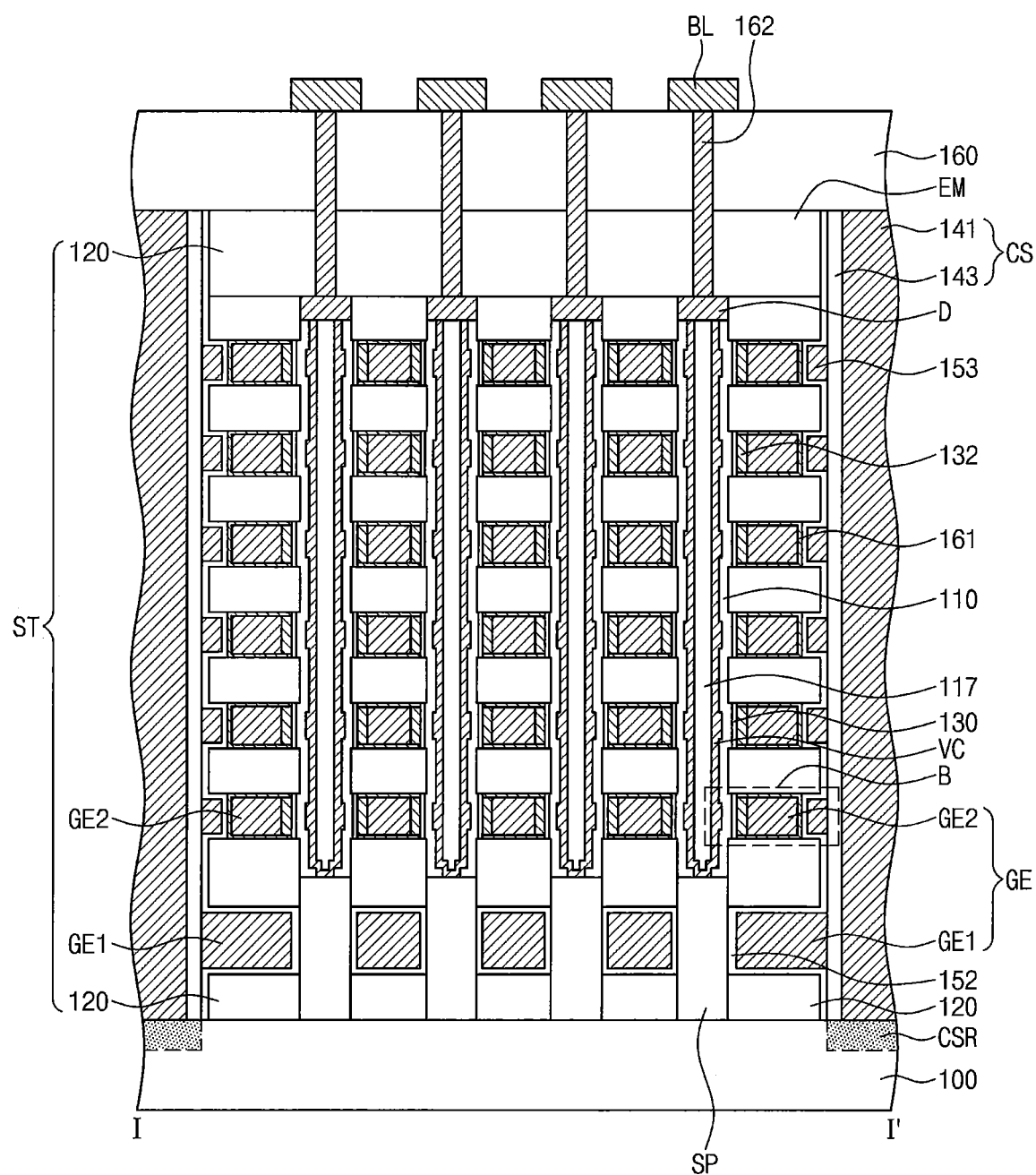
FIG. 6 is a cross-sectional view taken along the line I-I' of FIG. 2 to illustrate a semiconductor memory device according to some embodiments of the inventive concepts.
Figure 7:
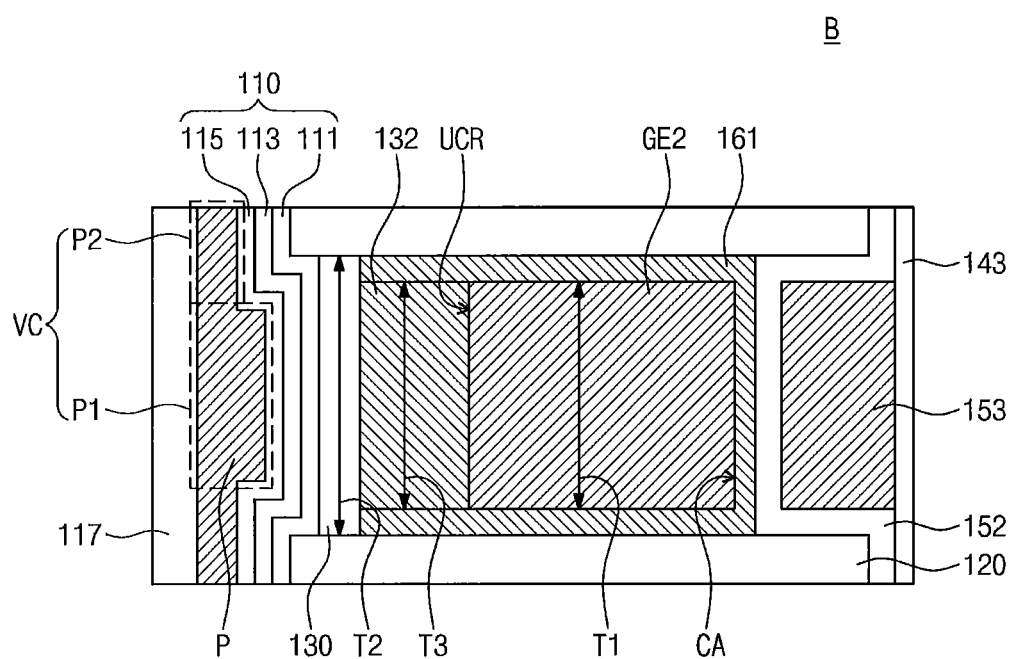
FIG. 7 is an enlarged view of a portion 'B' of FIG. 6.

FIG. 6 is a cross-sectional view taken along the line I-I' of FIG. 2 to illustrate a semiconductor memory device according to some embodiments of the inventive concepts. FIG. 7 is an enlarged view of a portion 'B' of FIG. 6. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIGS. 6 and 7, at least a portion of the charge storage structure 110 disposed between the second gate electrode GE2 and the vertical channel portion VC may be disposed in the undercut region UCR. The charge storage structure 110 may vertically extend to be disposed between the vertical channel portion VC and the insulating patterns 120. In other words, a portion of the charge storage structure 110 disposed between the second gate electrode GE2 and the vertical channel portion VC may laterally protrude toward the second gate electrode GE2. The charge storage structure 110 may have a substantially uniform thickness.

The vertical channel portion VC may include a first portion P1 disposed between the capping layer 117 and the second gate electrode GE2, and a second portion P2 disposed between the capping layer 117 and the insulating pattern 120. The first portion P1 of the vertical channel portion VC may include a protrusion P protruding toward the second gate electrode GE2. Thus, a lateral thickness of the first portion P1 of the vertical channel portion VC may be greater than that of the second portion P2 of the vertical channel portion VC.

Figure 8:
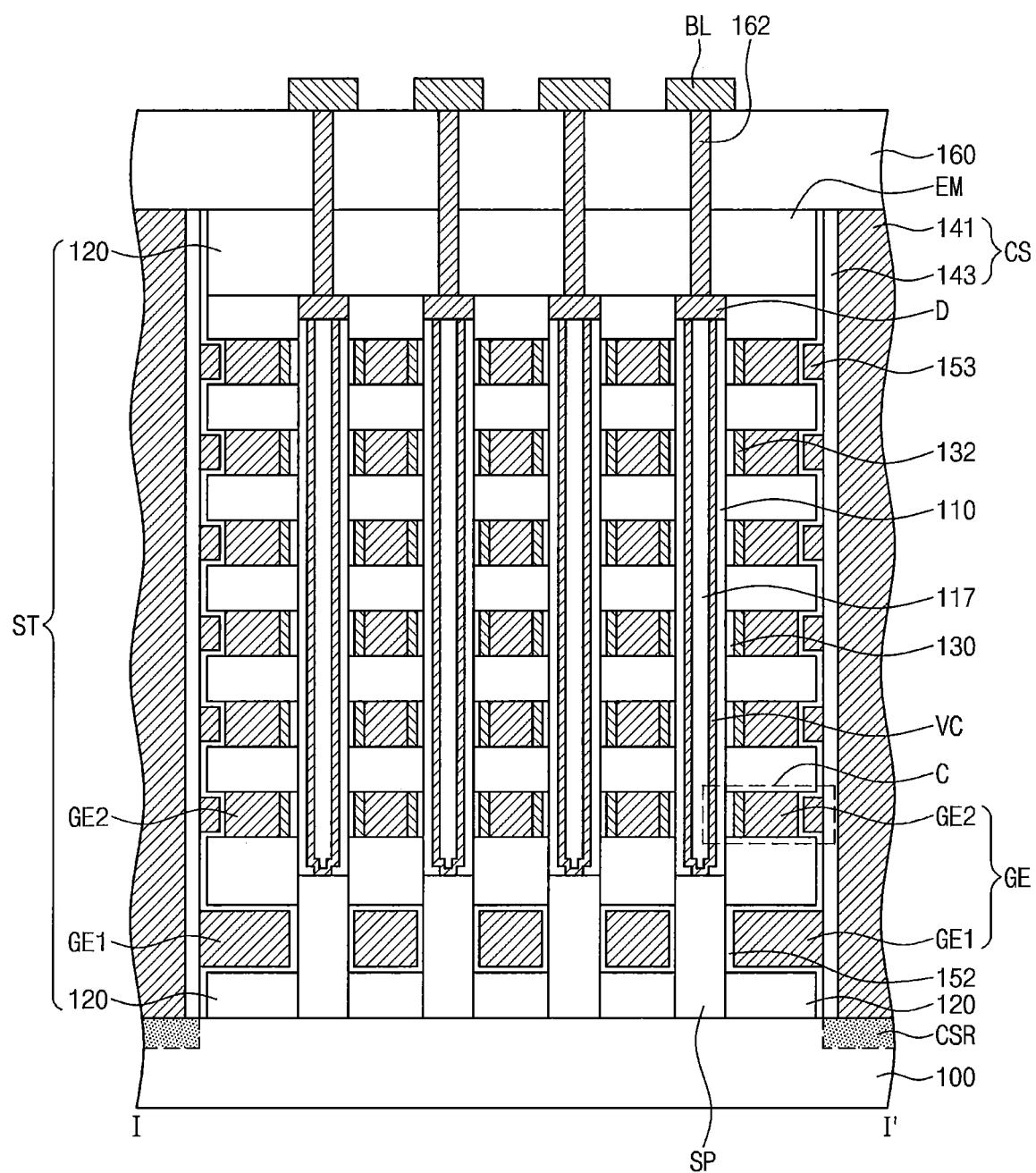
FIG. 8 is a cross-sectional view taken along the line I-I' of FIG. 2 to illustrate a semiconductor memory device according to some embodiments of the inventive concepts.
Figure 9:
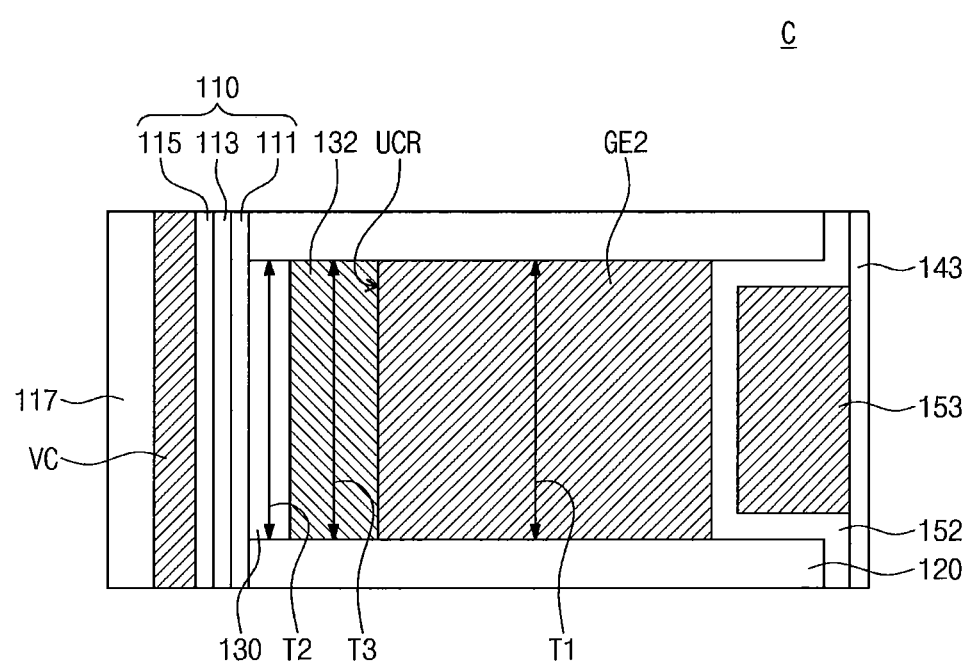
FIG. 9 is an enlarged view of a portion 'C' of FIG. 8 to illustrate a semiconductor memory device according to some embodiments of the inventive concepts.

FIG. 8 is a cross-sectional view taken along the line I-I' of FIG. 2 to illustrate a semiconductor memory device according to some embodiments of the inventive concepts. FIG. 9 is an enlarged view of a portion 'C' of FIG. 8 to illustrate a semiconductor memory device according to some embodiments of the inventive concepts. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIGS. 8 and 9, a vertical thickness T1 of the second gate electrode GE2 may be substantially equal to the vertical thickness T2 of the blocking pattern 130 and the vertical thickness T3 of the outer barrier pattern 132. Thus, the top surfaces of the second gate electrode GE2, the blocking pattern 130, and the outer barrier pattern 132 may be in contact with the insulating pattern 120 disposed directly thereon. In addition, the bottom surfaces of the second gate electrode GE2, the blocking pattern 130, and the outer barrier pattern 132 may be in contact with the insulating pattern 120 disposed directly thereunder.

The insulating layer 152 disposed between the second gate electrode GE2 and the additional metal pattern 153 may be in contact with the second gate electrode GE2. In other words, in some embodiments, the inner barrier patterns 161 of FIG. 3 may be omitted.

Figure 10:
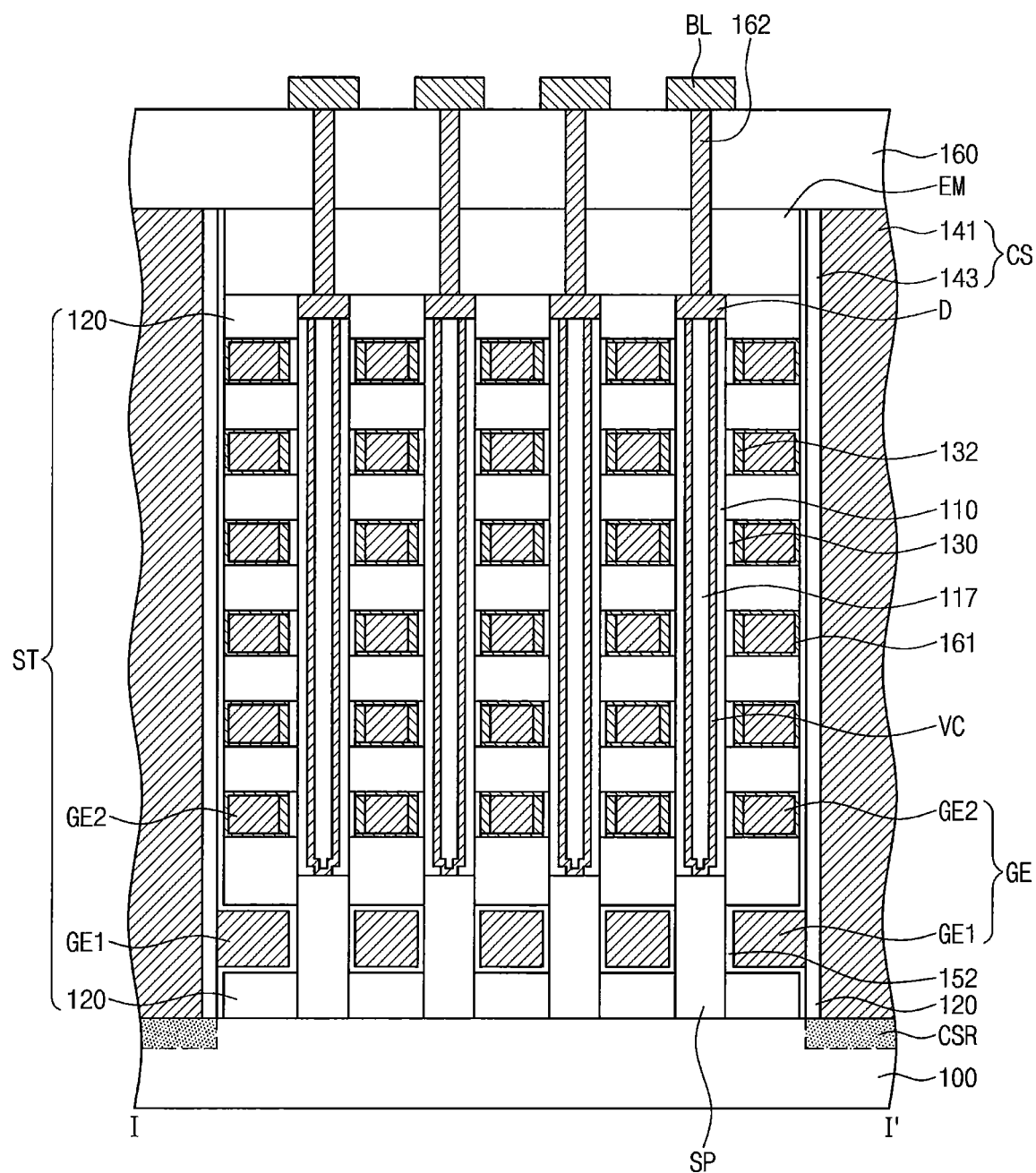
FIG. 10 is a cross-sectional view taken along the line I-I' of FIG. 2 to illustrate a semiconductor memory device according to some embodiments of the inventive concepts.

FIG. 10 is a cross-sectional view taken along the line I-I' of FIG. 2 to illustrate a semiconductor memory device according to some embodiments of the inventive concepts.

In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIG. 10, the spacer 143 may be disposed between the inner barrier pattern 161 and the common source contact 141. The insulating layer 152 may be disposed between the semiconductor pillar SP and the first gate electrode GE1 and may extend onto the top and bottom surfaces of the first gate electrode GE1. The insulating layer 152 may further extend between the spacer 143 and the insulating patterns 120 and between the spacer 143 and the inner barrier patterns 161. In other words, in some embodiments, the additional metal pattern 153 of FIG. 3 may be omitted.

Figure 11:
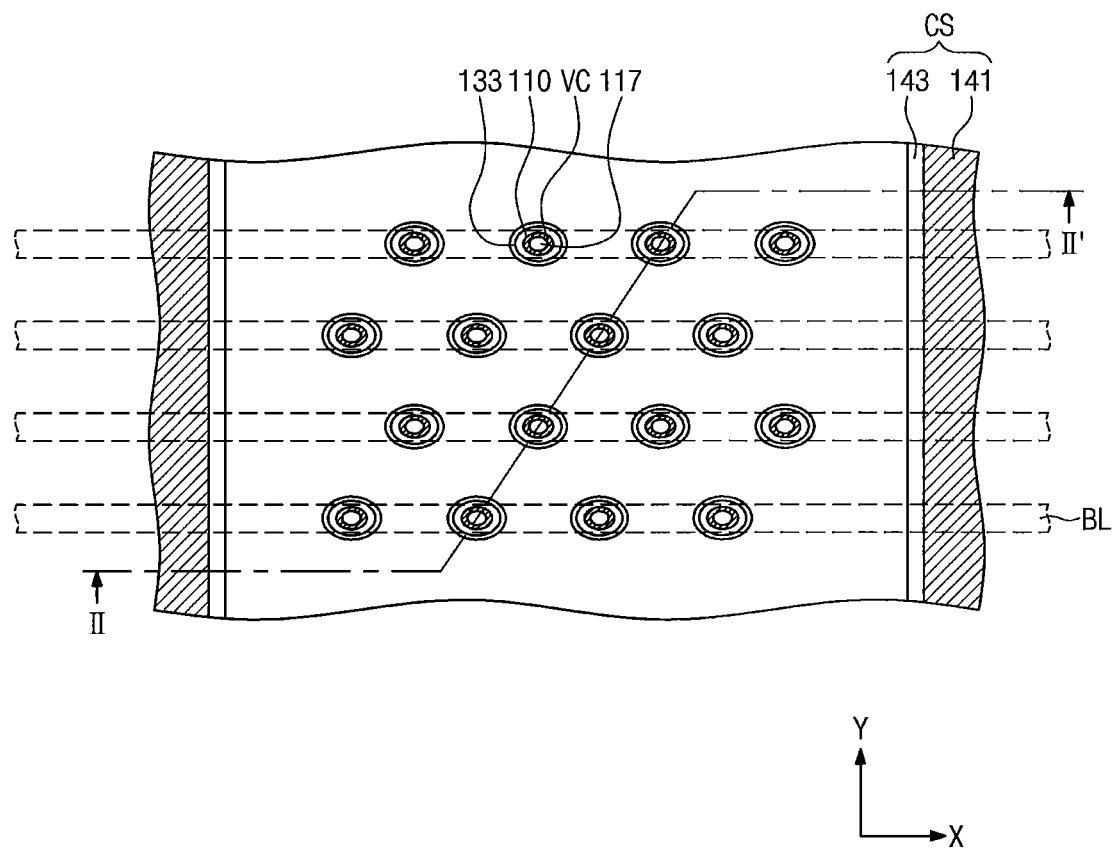
FIG. 11 is a plan view illustrating a semiconductor memory device according to some embodiments of the inventive concepts.
Figure 12:
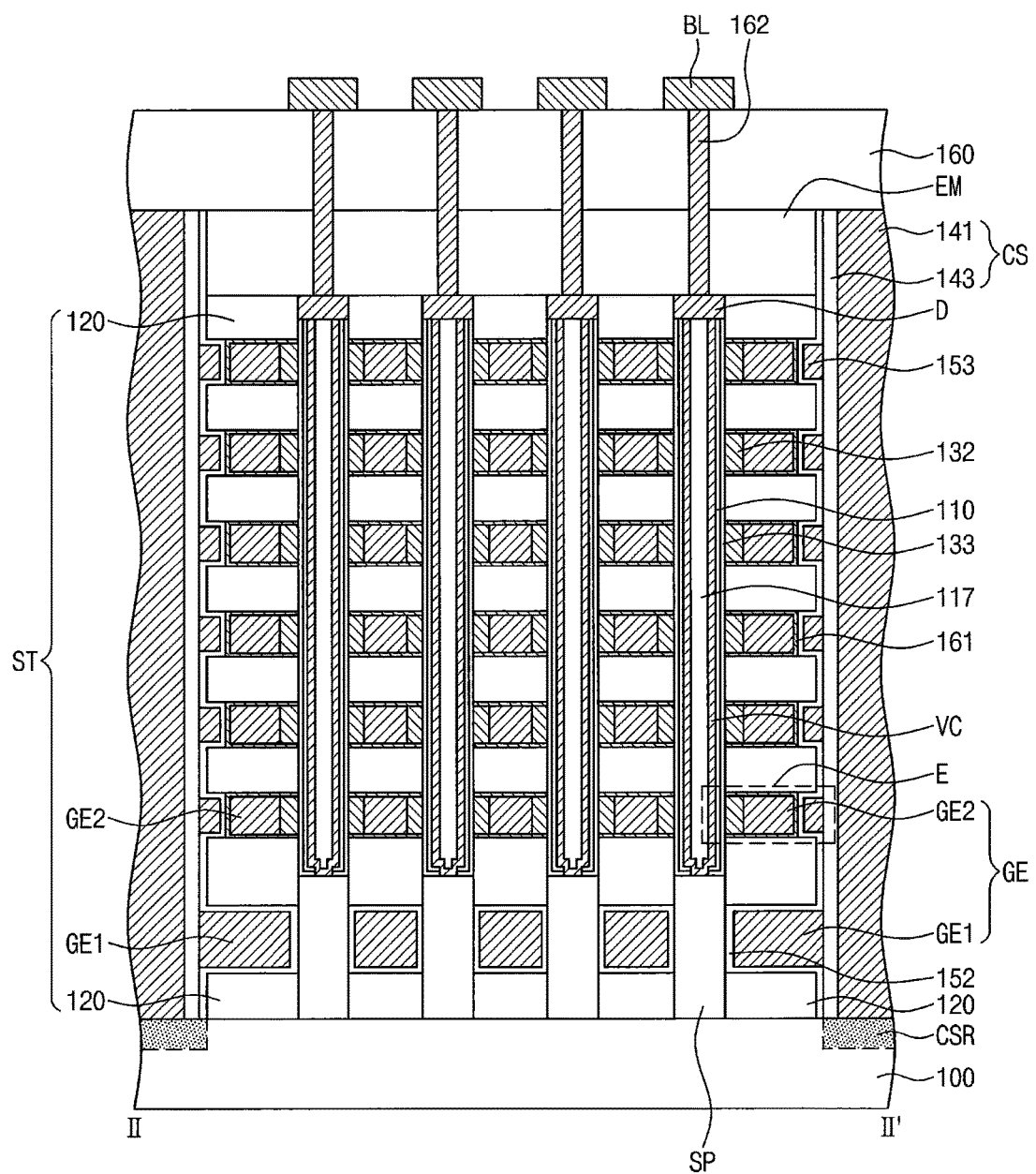
FIG. 12 is a cross-sectional view taken along a line II-II' of FIG. 11 to illustrate a semiconductor memory device according to some embodiments of the inventive concepts.
Figure 13:
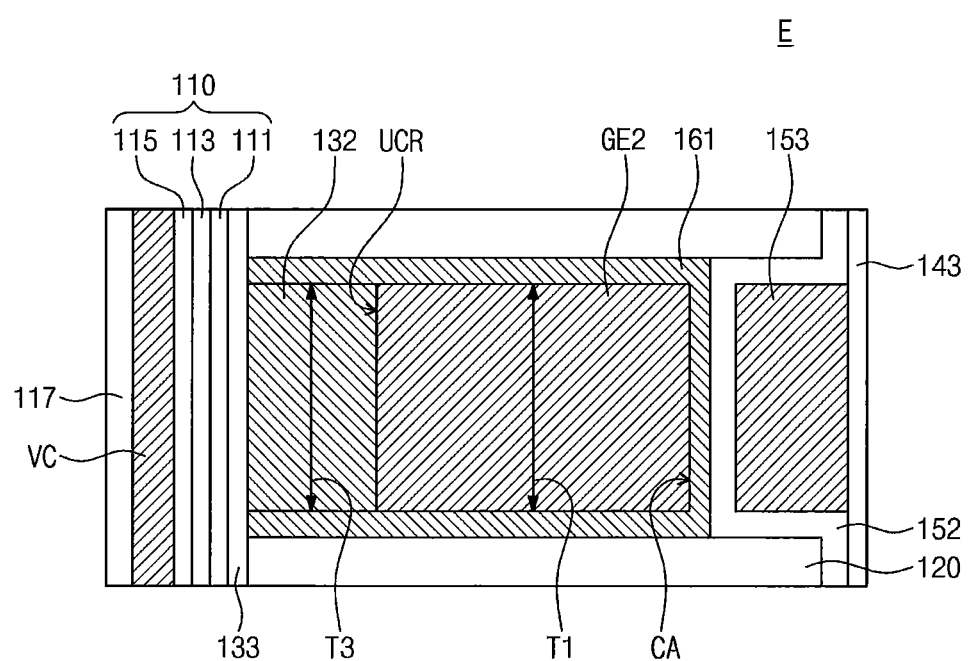
FIG. 13 is an enlarged view of a portion 'E' of FIG. 12.

FIG. 11 is a plan view illustrating a semiconductor memory device according to some embodiments of the inventive concepts. FIG. 12 is a cross-sectional view taken along a line II-II' of FIG. 11 to illustrate a semiconductor memory device according to some embodiments of the inventive concepts. FIG. 13 is an enlarged view of a portion 'E' of FIG. 12. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIGS. 11 to 13, a vertical insulating layer 133 may be disposed between the charge storage structure 110 and the stack structure ST. The vertical insulating layer 133 may be disposed between the blocking insulating layer 111 and the outer barrier pattern 132 and may vertically extend. Thus, the vertical insulating layer 133 may be in contact with sidewalls of the insulating patterns 120 and the top surface of the semiconductor pillar SP. The vertical insulating layer 133 may correspond to a portion of a blocking insulating layer. In other words, the reference numeral 111 may be defined as a first blocking insulating layer 111, the vertical insulating layer 133 may be defined as a second blocking insulating layer 133, and the blocking insulating layer may include the first and second blocking insulating layers 111 and 133. For example, the vertical insulating layer 133 may include at least one of a silicon oxide layer or a high-k dielectric layer (e.g., an aluminum oxide ($Al_2O_3$) layer or a hafnium oxide ($HfO_2$) layer).

Figure 14:
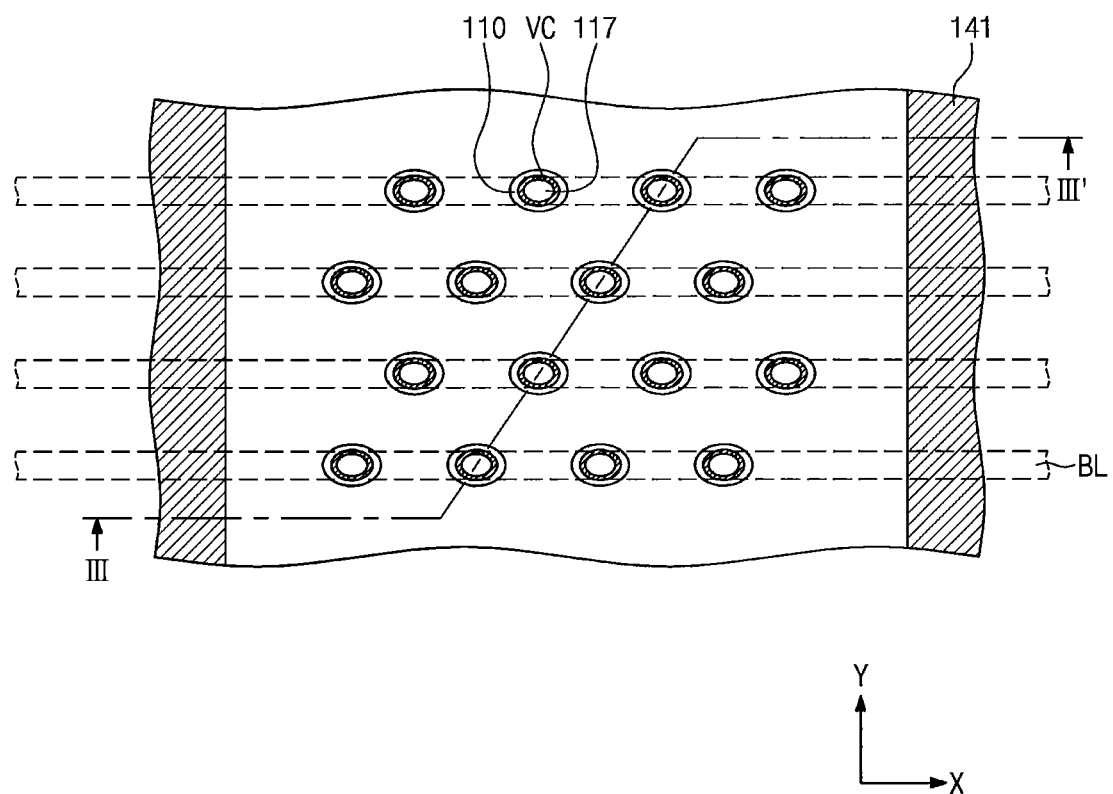
FIG. 14 is a plan view illustrating a semiconductor memory device according to some embodiments of the inventive concepts.
Figure 15:
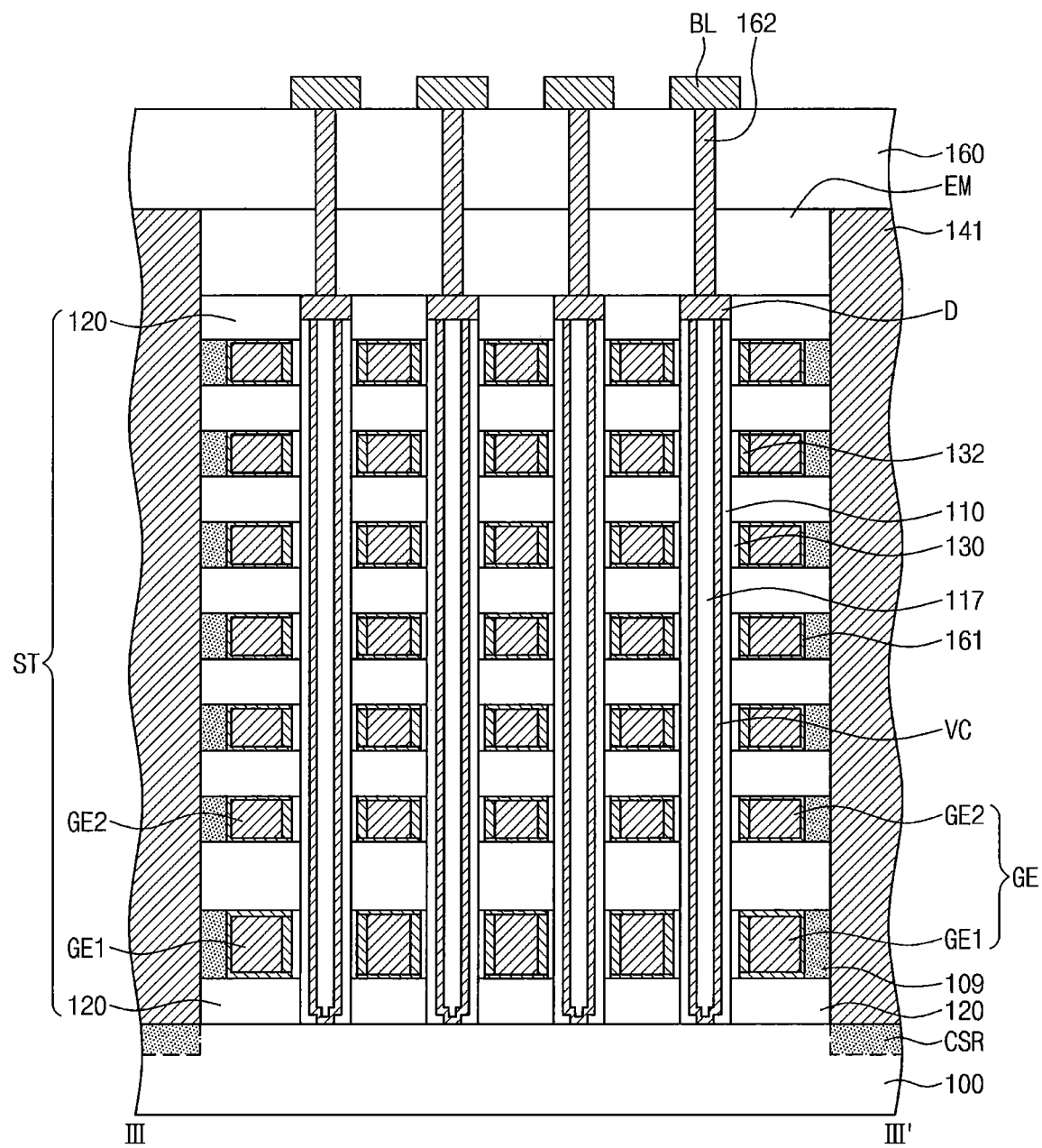
FIG. 15 is a cross-sectional view taken along a line of FIG. 14 to illustrate a semiconductor memory device according to some embodiments of the inventive concepts.

FIG. 14 is a plan view illustrating a semiconductor memory device according to some embodiments of the inventive concepts. FIG. 15 is a cross-sectional view taken along a line of FIG. 14 to illustrate a semiconductor memory device according to some embodiments of the inventive concepts. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIGS. 14 and 15, the vertical channel portion VC may penetrate the stack structure ST. The vertical channel portion VC may be connected to the substrate 100 and may extend in the direction vertical (i.e. perpendicular) to the top surface of the substrate 100. The vertical channel portion VC may intersect at least one sidewall of the first and second gate electrodes GE1 and GE2.

The charge storage structure 110 may be disposed between the vertical channel portion VC and the stack structure ST. The charge storage structure 110 may be disposed between the vertical channel portion VC and the first gate electrode GE1 and between the vertical channel portion VC and the second gate electrodes GE2. The charge storage structure 110 may vertically extend along the sidewall of the vertical channel portion VC.

The blocking pattern 130 may be disposed between the charge storage structure 110 and each of the gate electrodes GE. The blocking patterns 130 may be vertically spaced apart from each other. In other words, the blocking patterns 130 may be disposed between the charge storage structure 110 and the first gate electrode GE1 and between the charge storage structure 110 and the second gate electrodes GE2, respectively.

The outer barrier pattern 132 may be disposed between each of the blocking patterns 130 and each of the gate electrodes GE. The outer barrier patterns 132 may be vertically spaced apart from each other. In other words, the outer barrier patterns 132 may be disposed between the first gate electrode GE1 and the blocking pattern 130 and between the second gate electrodes GE2 and the blocking patterns 130, respectively.

The common source contacts 141 may be disposed at both sides of the stack structure ST, respectively. The common source contact 141 may be connected to the dopant region CSR disposed in the substrate 100 and may vertically extend along the sidewall of the stack structure ST. In addition, the common source contact 141 may extend in the second direction Y along the dopant region CSR.

A residual insulating pattern 109 may be disposed between the common source contact 141 and each of the gate electrodes GE. The residual insulating patterns 109 may be vertically spaced apart from each other. In other words, the residual insulating patterns 109 may be disposed between the common source contact 141 and the first gate electrode GE1 and between the common source contact 141 and the second gate electrodes GE2, respectively. At least one sidewall of the residual insulating patterns 109 and at least one sidewall of the insulating patterns 120 may be in contact with the common source contact 141. The sidewalls of the residual insulating patterns 109 may be vertically coplanar with the sidewalls of the insulating patterns 120. For example, the residual insulating patterns 109 may include silicon nitride.

FIGS. 16 to 30 are cross-sectional views taken along the line I-I' of FIG. 2 to illustrate methods of manufacturing a semiconductor memory device according to some embodiments of the inventive concepts.

Figure 16:
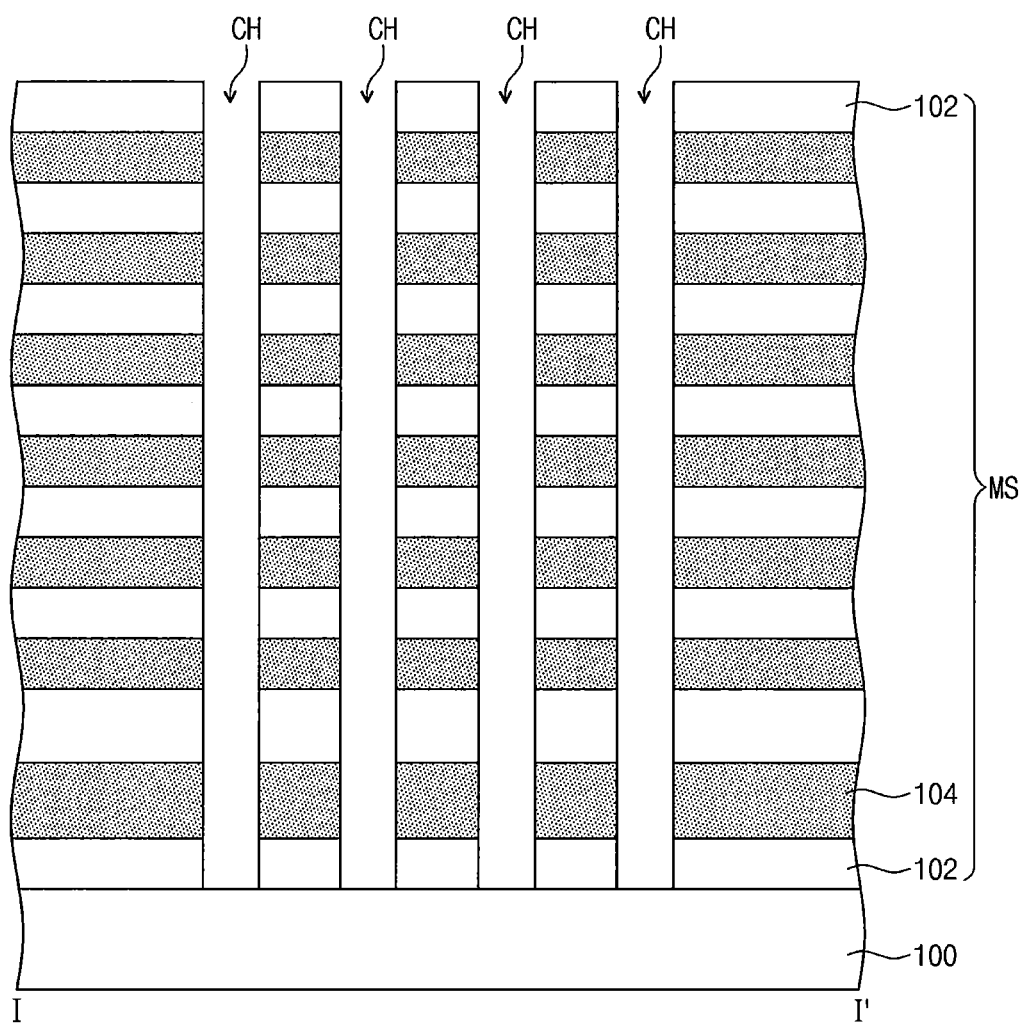
FIGS. 16 to 30 are cross-sectional views taken along the line I-I' of FIG. 2 to illustrate methods of manufacturing semiconductor memory devices according to some embodiments of the inventive concepts.

Referring to FIG. 16, a mold structure MS may be formed on a substrate 100. The substrate 100 may be a silicon substrate, a silicon-germanium substrate, a germanium substrate, or a single-crystalline epitaxial layer grown on a single-crystalline silicon substrate.

The mold structure MS may include insulating layers 102 and sacrificial layers 104 which are alternately and repeatedly stacked on the substrate 100. The sacrificial layers 104 may include a material having an etch selectivity with respect to the insulating layers 102. For example, the insulating layers 102 may include silicon oxide, and the sacrificial layers 104 may include silicon nitride and/or silicon oxynitride. The insulating layers 102 may be formed of the same material, and the sacrificial layers 104 may be formed of the same material. Even though not shown in the drawings, a buffer insulating layer may be formed between the substrate 100 and the mold structure MS.

The mold structure MS may be patterned to form channel holes CH exposing the substrate 100. For example, a mask pattern (not shown) may be formed on the uppermost one of the insulating layers 102, and the mold structure MS may be anisotropically etched using the mask pattern as an etch mask to form the channel holes CH. In some embodiments, the channel hole CH may have a substantially uniform width. In some embodiments, the width of the channel hole CH may be varied depending on a height from the substrate 100. For example, the channel hole CH may have an inclined sidewall. The top surface of the substrate 100 under the channel holes CH may be recessed by over-etching in the anisotropic etching process. Each of the channel holes CH may have a circular shape, an elliptic shape, or a polygonal shape when viewed from a plan view.

Figure 17:
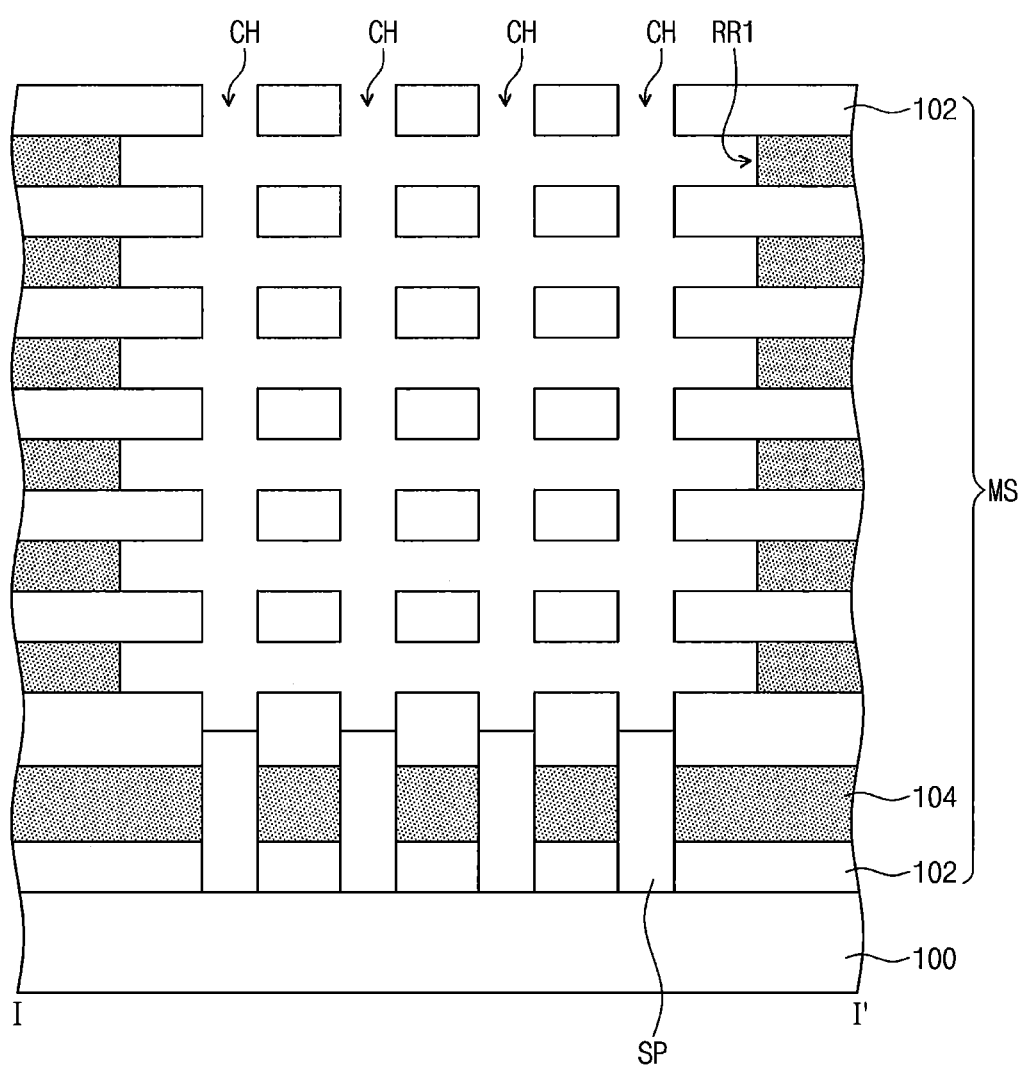

Referring to FIG. 17, a semiconductor pillar SP may be formed in a lower portion of each of the channel holes CH. The semiconductor pillars SP may be formed by performing a selective epitaxial growth (SEG) process using the substrate 100 exposed by the channel holes CH as a seed. The semiconductor pillar SP may be grown until a top surface of the semiconductor pillar SP is disposed at a higher level than a top surface of the lowermost one of the sacrificial layers 104. Thus, the semiconductor pillar SP may cover inner sidewalls of the lowermost insulating layer 102 and the lowermost sacrificial layer 104, which are exposed by each of the channel holes CH. For example, the semiconductor pillar SP may be formed of an intrinsic semiconductor material or a semiconductor material doped with P-type dopants.

The sacrificial layers 104 exposed by the channel holes CH may be etched, and thus portions of the sacrificial layers 104 may be removed. The sacrificial layers 104 may be etched by an etching process using an etching solution (e.g., phosphoric acid) having an etch selectivity with respect to the insulating layers 102. Sidewalls of the sacrificial layers 104 may be laterally recessed from sidewalls of the insulating layers 102 by the etching process. First recess regions RR1 may be formed in etched regions of the sacrificial layers 104. Each of the first recess regions RR1 may be defined by the insulating layers 102 vertically adjacent to each other and the recessed sidewall of each of the sacrificial layers 104.

Each of the first recess regions RR1 may include a recess region formed by etching the sacrificial layers 104 provided between the channel holes CH. Top and bottom surfaces of the insulating layers 102 provided between the channel holes CH may be exposed by the recess regions formed between the channel holes CH. Etched amounts of the sacrificial layers 104 may be adjusted such that a portion of the sacrificial layer 104 may remain in the recess region between the channel holes CH. In some embodiments, the sacrificial layers 104 provided between the channel holes CH may be completely removed.

The lowermost sacrificial layer 104 not exposed through the channel holes CH by the semiconductor pillars SP may not be etched, and thus the first recess region RR1 may not be formed between the insulating layers 102 disposed directly on and under the lowermost sacrificial layer 104.

Figure 18:
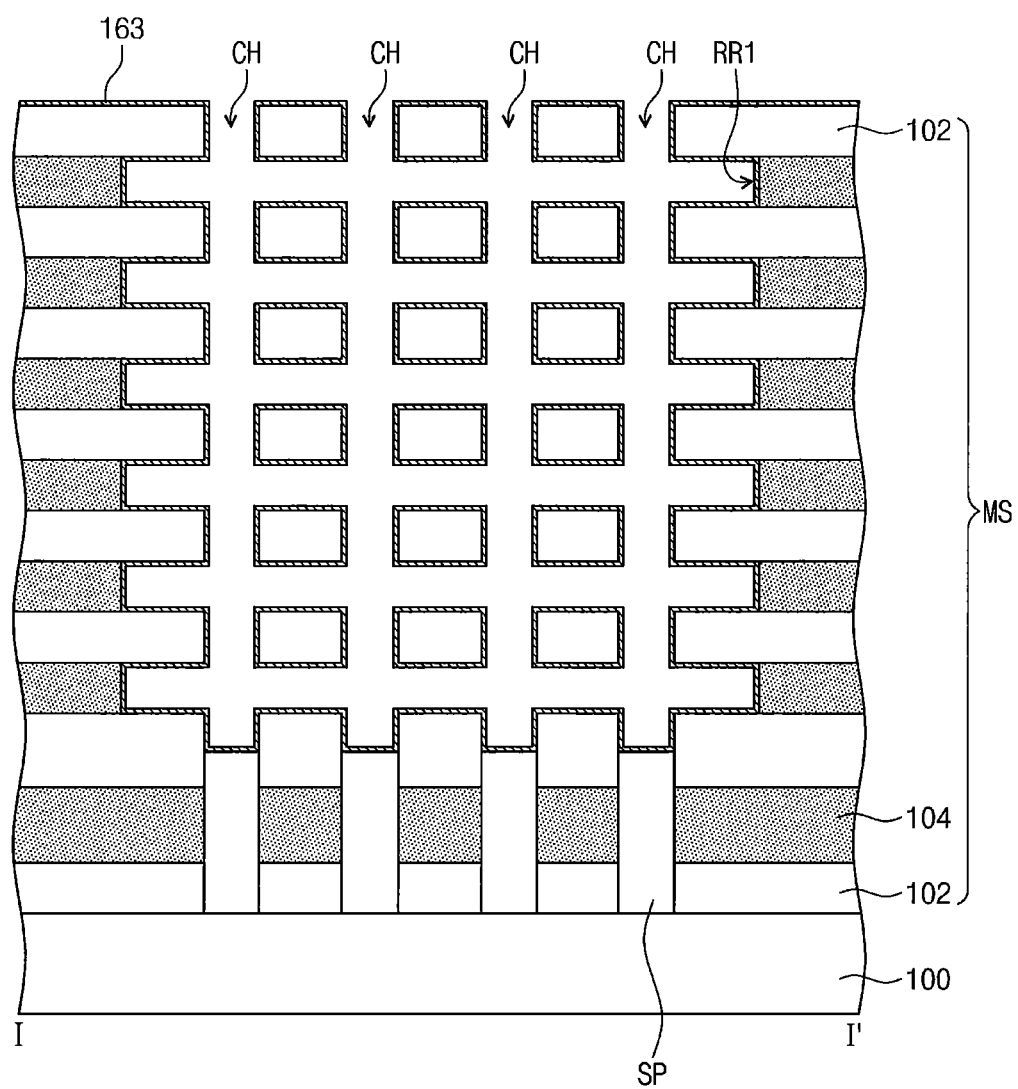

Referring to FIG. 18, a first barrier layer 163 may be formed to cover surfaces of the insulating layers 102 and surfaces of the sacrificial layers 104, which are exposed by the channel holes CH and the first recess regions RR1. In detail, the first barrier layer 163 may conformally cover sidewalls of the sacrificial layers 104 and top surfaces, bottom surfaces and sidewalls of the insulating layers 102, and top surfaces of the semiconductor pillars SP. The first barrier layer 163 may be formed using a chemical vapor deposition (CVD) or atomic layer deposition (ALD) method having an excellent step coverage property. For example, the first barrier layer 163 may be formed of a metal nitride layer such as a TiN layer, a TaN layer, or a WN layer. In some embodiments, the first barrier layer 163 may be omitted.

Figure 19:
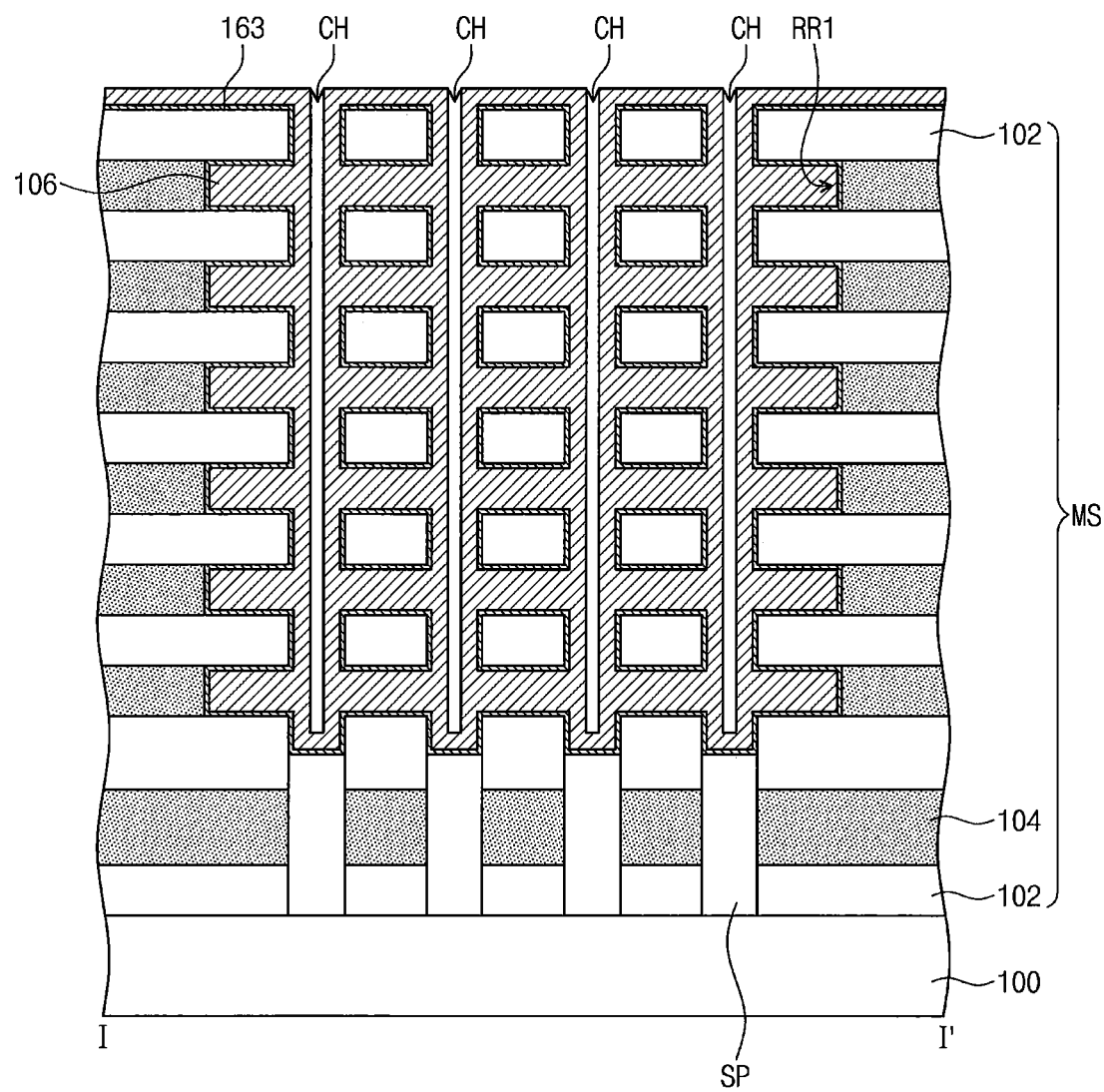

Referring to FIG. 19, a metal layer 106 may be formed in the first recess regions RR1 through the channel holes CH. The metal layer 106 may cover a surface of the first barrier layer 163 and may completely fill the first recess regions RR1. For example, the metal layer 106 may be formed using a CVD method or an ALD method. For example, the metal layer 106 may include tungsten.

A distance between the channel holes CH may be smaller than a distance between trenches T that will be formed in a subsequent process (e.g., FIG. 26) to define a stack structure ST. Thus, a lateral aspect ratio of the recess region between the channel holes CH may be smaller than a recess region which may be formed between the trenches T. Since the metal layer 106 is formed in the first recess regions RR1 through the channel holes CH, the first recess regions RR1 may be filled with the first metal layer 106 without a void. In some embodiments, the formation of the metal layer 106 in the recess region RR1 with the smaller aspect ratio may result in the formation of word lines (e.g. WL0 to WL2) without, or with fewer, voids as compared to a process which forms the word lines using trenches (e.g. FIG. 26) adjacent the stack structure ST.

Figure 20:
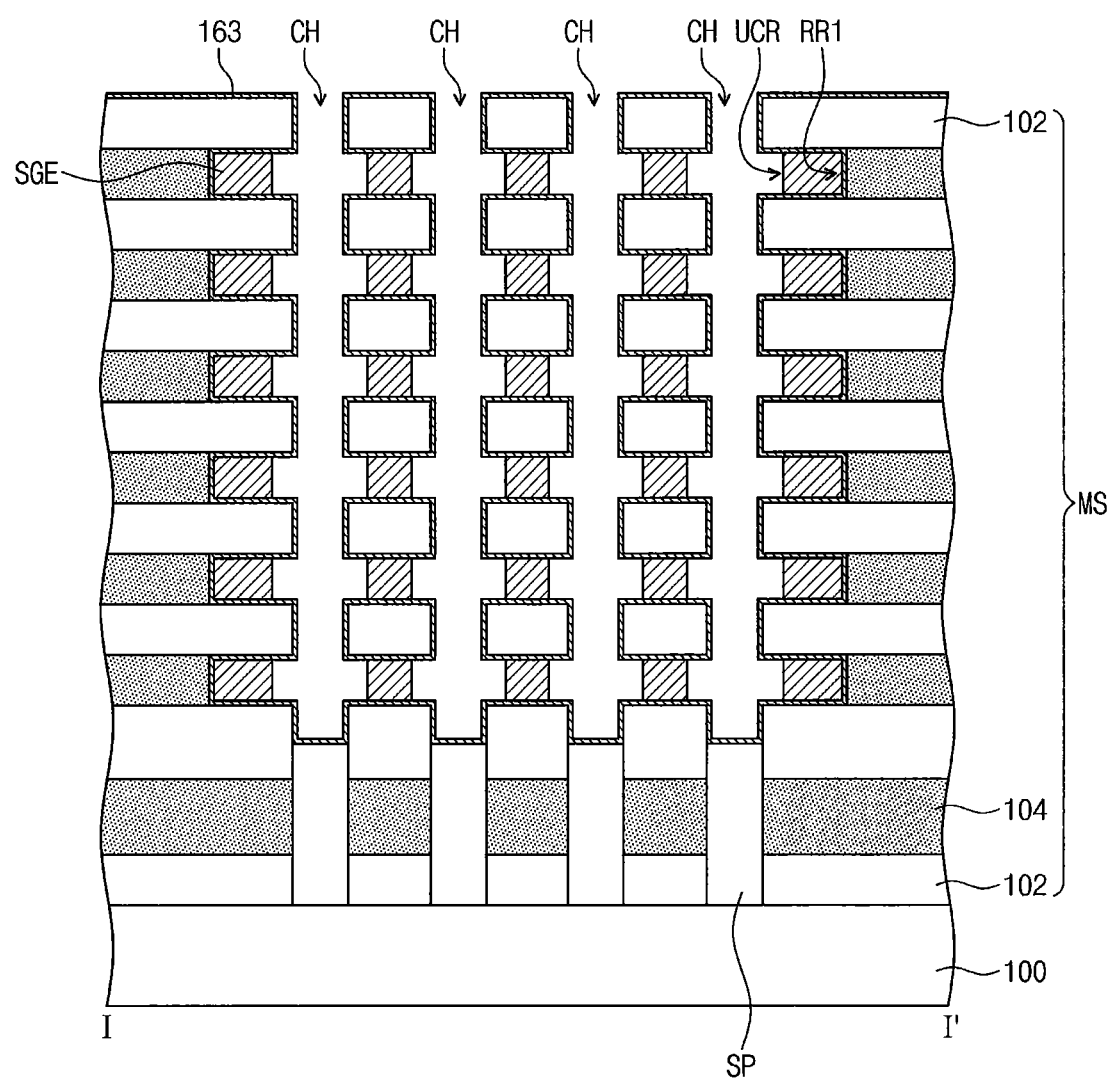

Referring to FIG. 20, a trimming process may be performed on the metal layer 106 to etch the metal layer 106. During the trimming process, the metal layer 106 disposed outside the first recess regions RR1 may be removed to locally leave portions of the metal layer 106 in the first recess regions RR1, respectively. The trimming process may include a wet etching process or a dry etching process. By the trimming process, the first barrier layer 163 disposed on sidewalls of the insulating layers 102 and the top surfaces of the semiconductor pillars SP may be exposed and gate electrodes SGE may be formed in the first recess regions RR1, respectively. The gate electrodes SGE may correspond to the second gate electrodes GE2 illustrated in FIG. 3.

The gate electrodes SGE exposed by the channel holes CH may be etched, and thus sidewalls of the gate electrodes SEG may be laterally recessed from the sidewalls of the insulating layers 102. The sidewalls of the gate electrodes SEG may be laterally recessed to form undercut regions UCR of which each is formed between the insulating layers 102 vertically adjacent to each other. The undercut region UCR may be defined by the sidewall of each of the gate electrodes SGE and the first barrier layer 163 covering a bottom surface and a top surface of the insulating layers 102 vertically adjacent to each other. The etching process of laterally recessing the gate electrodes SEG may include at least one of a dry etching process (e.g., an etch-back process, an ashing process, or a string process) or a wet etching process (e.g., a cleaning process).

Figure 21:
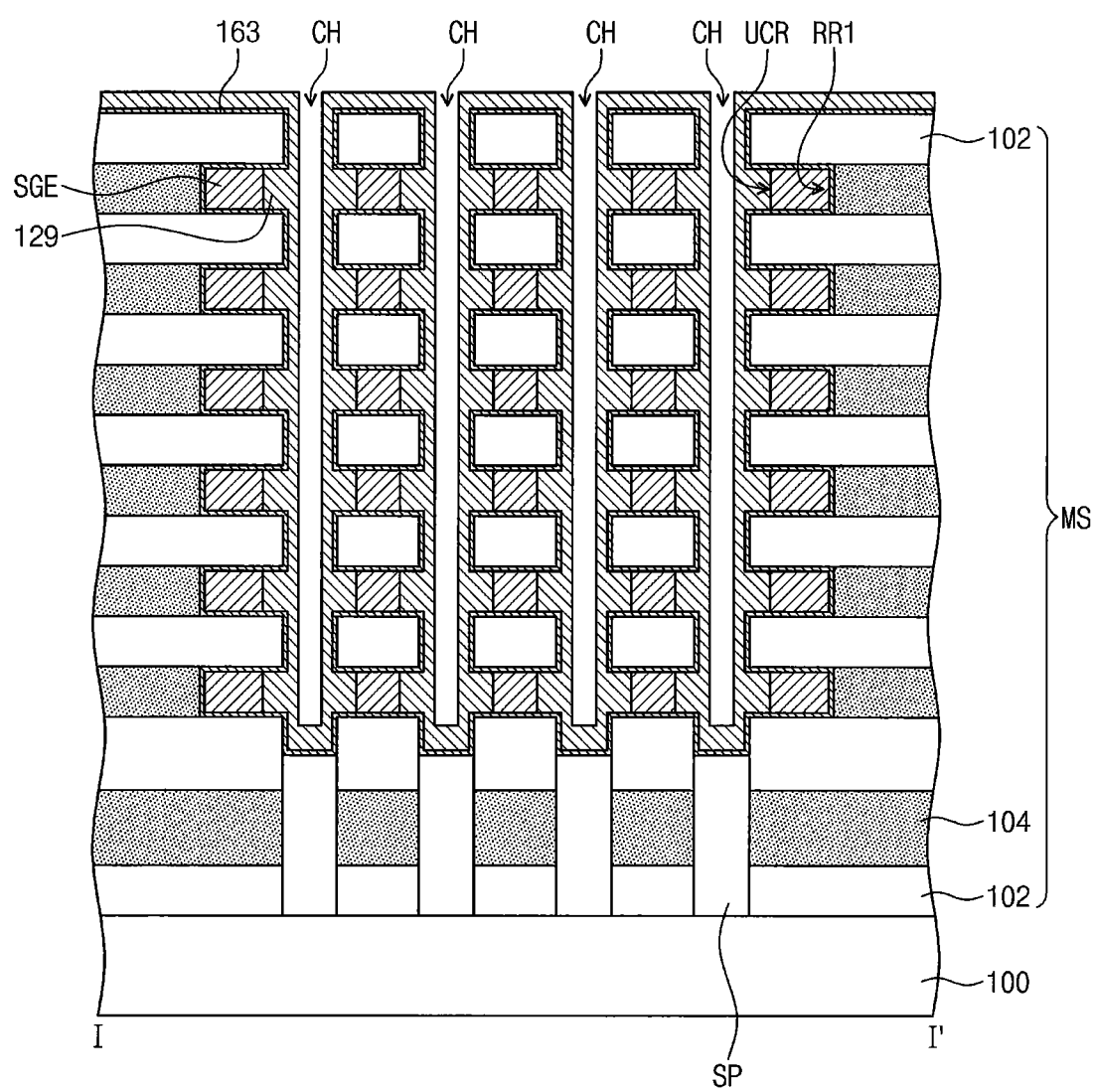

Referring to FIG. 21, a second barrier layer 129 may be formed in the channel holes CH. The second barrier layer 129 may be formed to cover the first barrier layer 163 and the sidewalls of the gate electrodes SGE. The second barrier layer 129 may completely fill the undercut regions UCR. The second barrier layer 129 may be formed using a physical vapor deposition (PVD) method, a CVD method, or an ALD method. For example, the second barrier layer 129 may be formed of a metal nitride layer such as a TiN layer, a TaN layer, or a WN layer.

Figure 22:
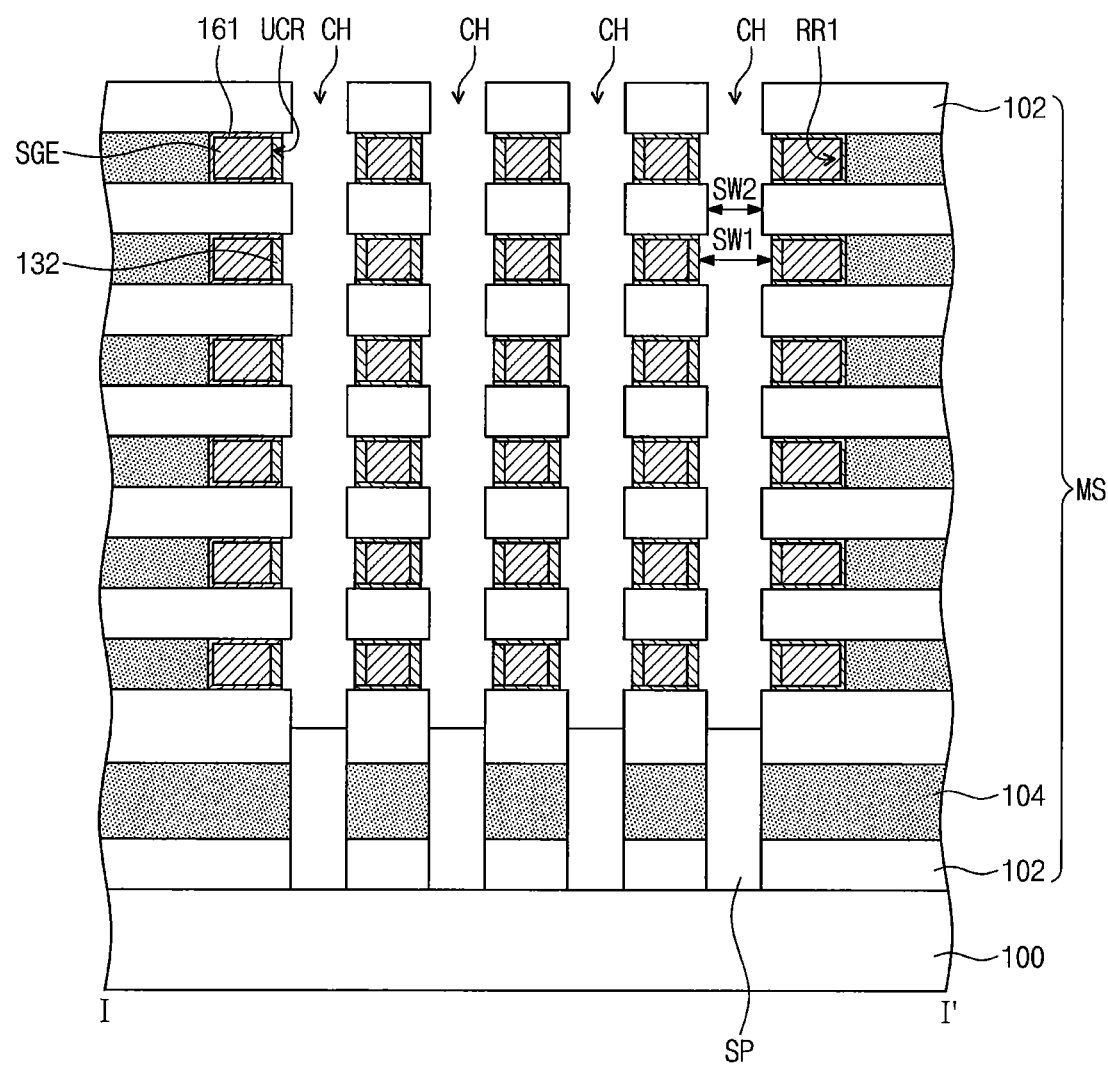

Referring to FIG. 22, the second barrier layer 129 and the first barrier layer 163 may be etched to form inner barrier patterns 161 and outer barrier patterns 132. The first and second barrier layers 163 and 129 in the channel holes CH may be removed by the etching process to expose the sidewalls of the insulating layers 102 and the top surfaces of the semiconductor pillars SP. Each of the inner barrier patterns 161 may be locally formed in each of the first recess regions RR1, and each of the outer barrier patterns 132 may be locally formed in each of the undercut regions UCR.

The etching process may be performed until a portion of the undercut region UCR is empty. In other words, the outer barrier pattern 132 may not completely fill the undercut region UCR. Thus, the undercut region UCR may expose the top surface of the insulating layer 102 thereunder and the bottom surface of the insulating layer 102 thereon. A width SW1 of the channel hole CH surrounded by the outer barrier pattern 132 may be greater than a width SW2 of the channel hole CH surrounded by the insulating layer 102 (SW1>SW2). In some embodiments, even though not shown in the drawings, the outer barrier pattern 132 may completely fill the undercut region UCR. Accordingly, the width SW1 of the channel hole CH surrounded by the outer barrier pattern 132 may be equal to the width SW2 of the channel hole CH surrounded by the insulating layer 102 (SW1=SW2).

In some embodiments, the first barrier layer 163 and the second barrier layer 129 may include the same material. Accordingly, the first and second barrier layers 163 and 129 may be etched by the same etching process. In some embodiments, the first barrier layer 163 may include a different material from the second barrier layer 129. Accordingly, the first and second barrier layers 163 and 129 may be etched by different etching processes from each other. The etching process may include at least one of a dry etching process (e.g., an etch-back process, an ashing process, or a string process) or a wet etching process (e.g., a cleaning process).

Figure 23:
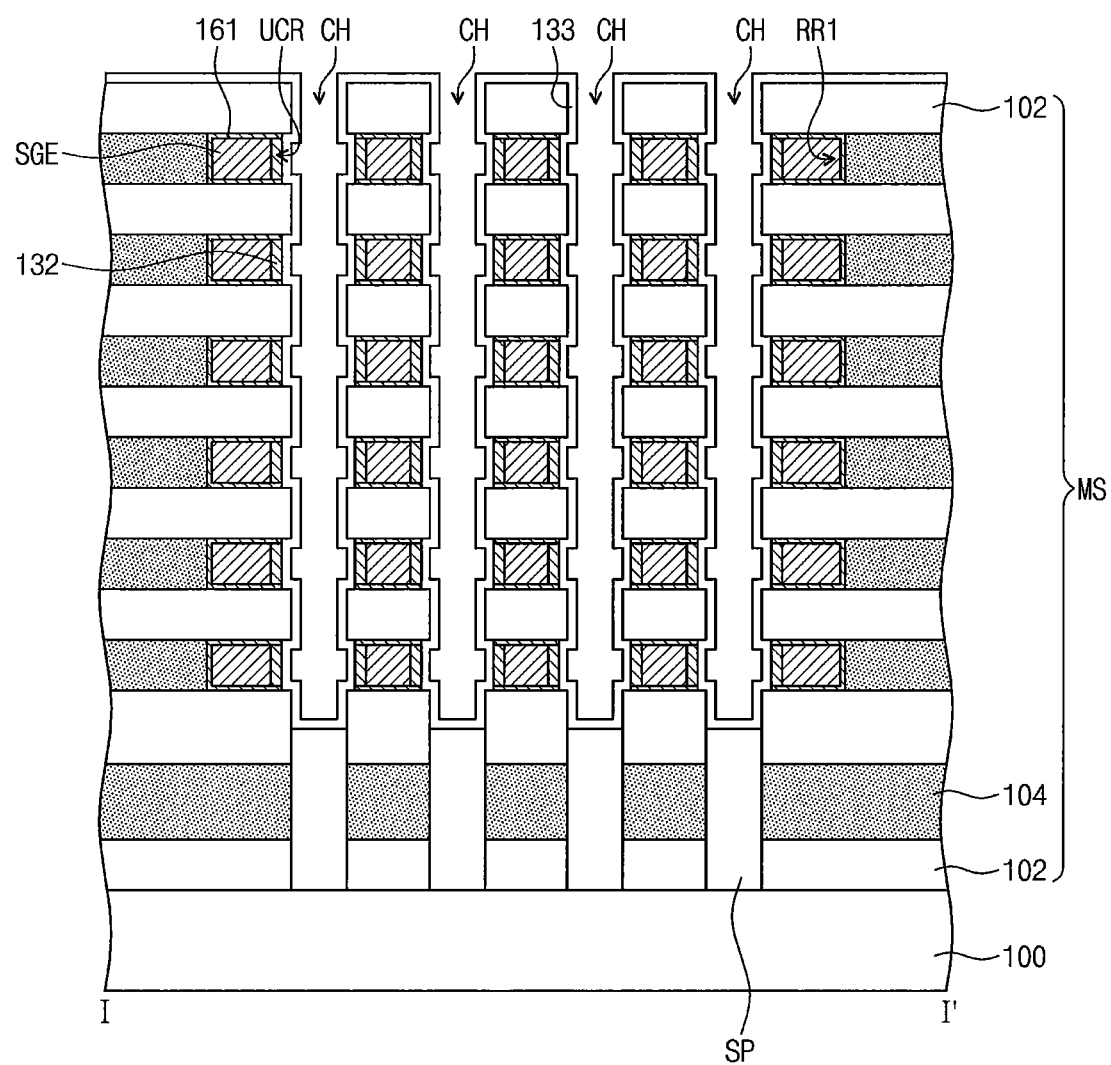

Referring to FIG. 23, a vertical insulating layer 133 may be formed in the channel holes CH. The vertical insulating layer 133 may conformally cover sidewalls of the outer barrier patterns 132 and top and bottom surfaces of the insulating layers 102, which are exposed by the undercut regions UCR. In addition, the vertical insulating layer 133 may conformally cover the top surfaces of the semiconductor pillars SP and the top surface of the uppermost insulating layer 102. The vertical insulating layer 133 may be single-layered or multi-layered. For example, the vertical insulating layer 133 may correspond to at least a portion of a blocking insulating layer of a charge trap-type non-volatile memory transistor. For example, the vertical insulating layer 133 may be formed of a dielectric layer (e.g., a high-k dielectric layer such as an aluminum oxide ($Al_2O_3$) layer, a hafnium oxide layer ($HfO_2$) layer, a zirconium oxide ($ZrO_2$) layer, a hafnium-aluminum oxide (HfAlO) layer, and/or a hafnium-silicon oxide (HfSiO) layer.

Figure 24:
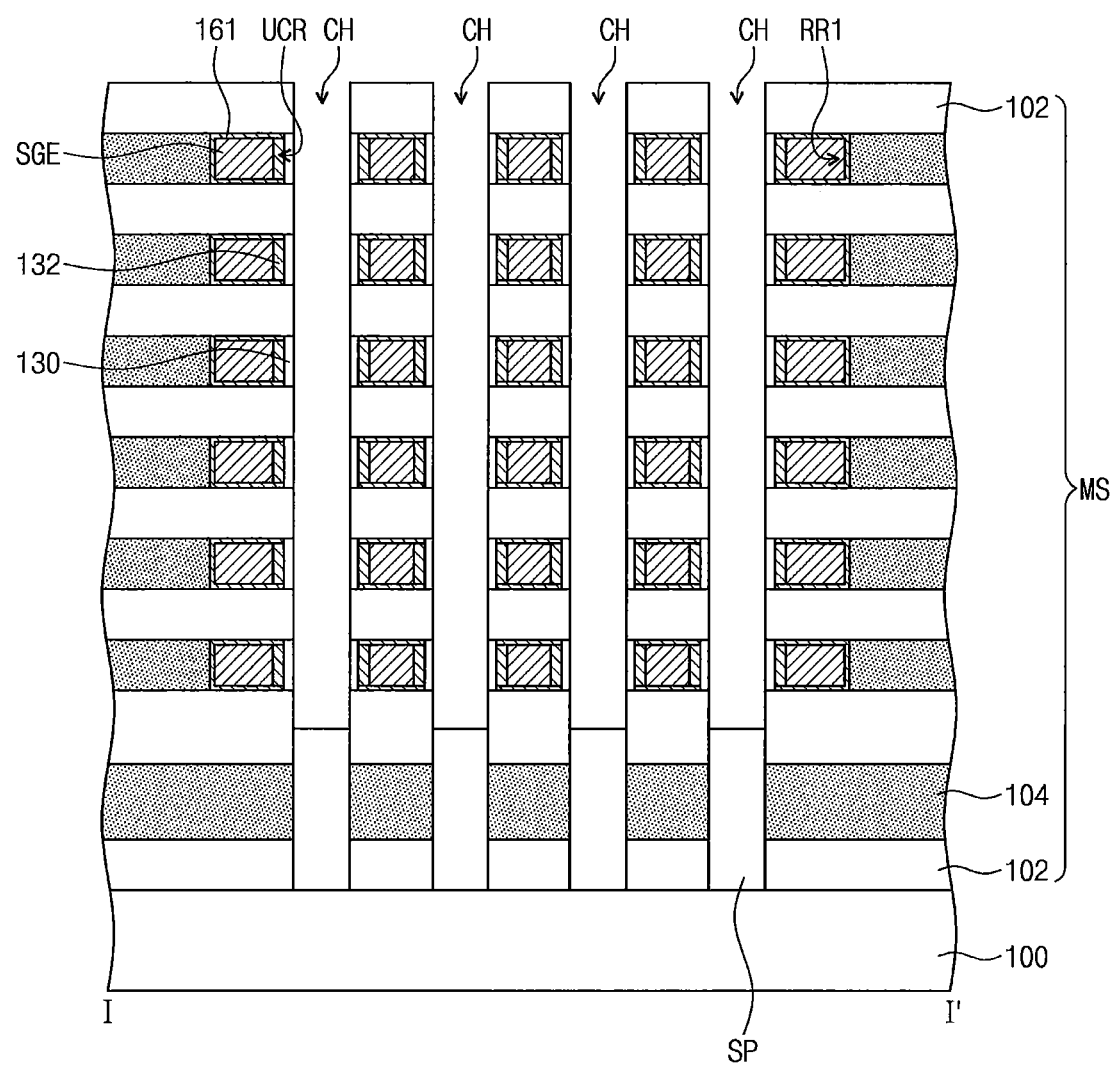

Referring to FIG. 24, the vertical insulating layer 133 may be etched to form blocking patterns 130. At this time, the vertical insulating layer 133 disposed on the sidewalls of the insulating layers 102, the top surfaces of the semiconductor pillars SP, and the top surface of the uppermost insulating layer 102 may be etched to the sidewalls of the insulating layers 102 and the top surfaces of the semiconductor pillars SP through the channel holes CH. The blocking patterns 130 may be vertically spaced apart from each other so as to be locally formed in the undercut regions UCR vertically stacked. The etching process for etching the vertical insulating layer 133 may include at least one of a dry etching process (e.g., an etch-back process, an ashing process, or a string process) or a wet etching process (e.g., a cleaning process).

Figure 25:
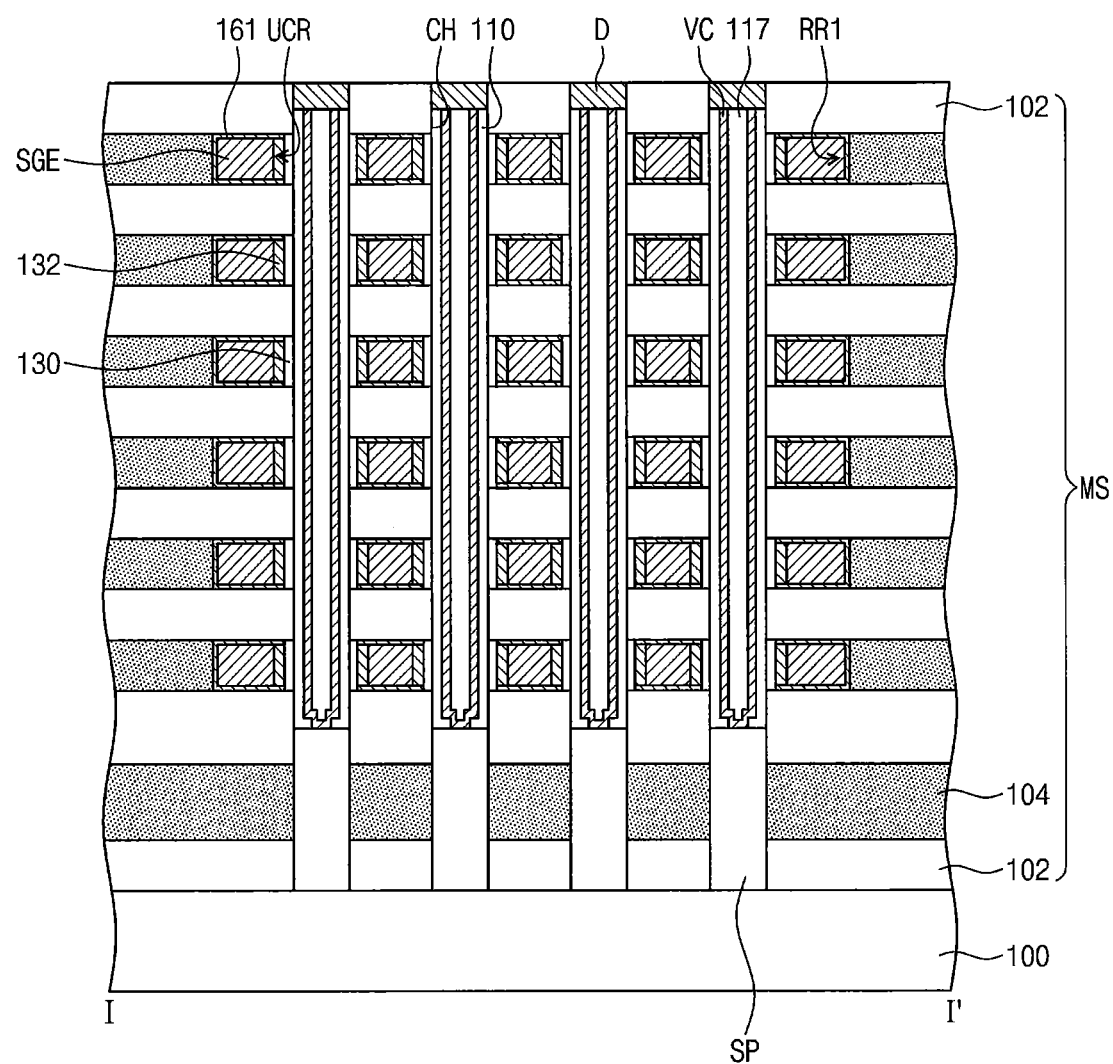

Referring to FIG. 25, a charge storage structure 110, a vertical channel portion VC, and a capping layer 117 may be formed in each of the channel holes CH. The charge storage structure 110 may conformally cover the sidewalls of the insulating layers 102, sidewalls of the blocking patterns 130, and the top surface of the semiconductor pillar SP, which are exposed through each of the channel holes CH. The vertical channel portion VC may penetrate the channel storage structure 110 disposed on the top surface of the semiconductor pillar SP. As illustrated in FIG. 4, the channel storage structure 110 may include the blocking insulating layer 111, a charge storage layer 113, and a tunnel insulating layer 115 which are sequentially stacked on the sidewall of the channel hole CH. For example, the blocking insulating layer 111 may be formed of at least one of a silicon oxide layer or a high-k dielectric layer (e.g., $Al_2O_3$ or $HfO_2$), the charge storage layer 113 may be formed of a silicon nitride layer, and the tunnel insulating layer 115 may be formed of at least one of a silicon oxide layer or a high-k dielectric layer (e.g., $Al_2O_3$ or $HfO_2$).

The vertical channel portion VC may conformally cover a surface of the charge storage structure 110 and may penetrate the charge storage structure 110 so as to be connected to the semiconductor pillar SP. The vertical channel portion VC may include a semiconductor material. For example, the vertical channel portion VC may include at least one of a poly-crystalline silicon layer, an organic semiconductor layer, or a carbon nanostructure.

The capping layer 117 may fill the inner space of the vertical channel portion VC in each of the channel holes CH. The capping layer 117 may be formed using a spin-on-glass (SOG) technique. The capping layer 117 may include an insulating material, e.g., silicon oxide and/or silicon nitride.

A pad D may be formed on the charge storage structure 110, the vertical channel portion VC, and the capping layer 117 formed in each of the channel holes CH. In some embodiments, upper portions of the vertical channel portion VC, and the capping layer 117 may be recessed, and the recessed region may be filled with a conductive material, thereby forming the pad D. In some embodiments, the pad D may be formed by doping an upper portion of the vertical channel portion VC with dopants having a different conductivity type from the vertical channel portion VC.

Figure 26:
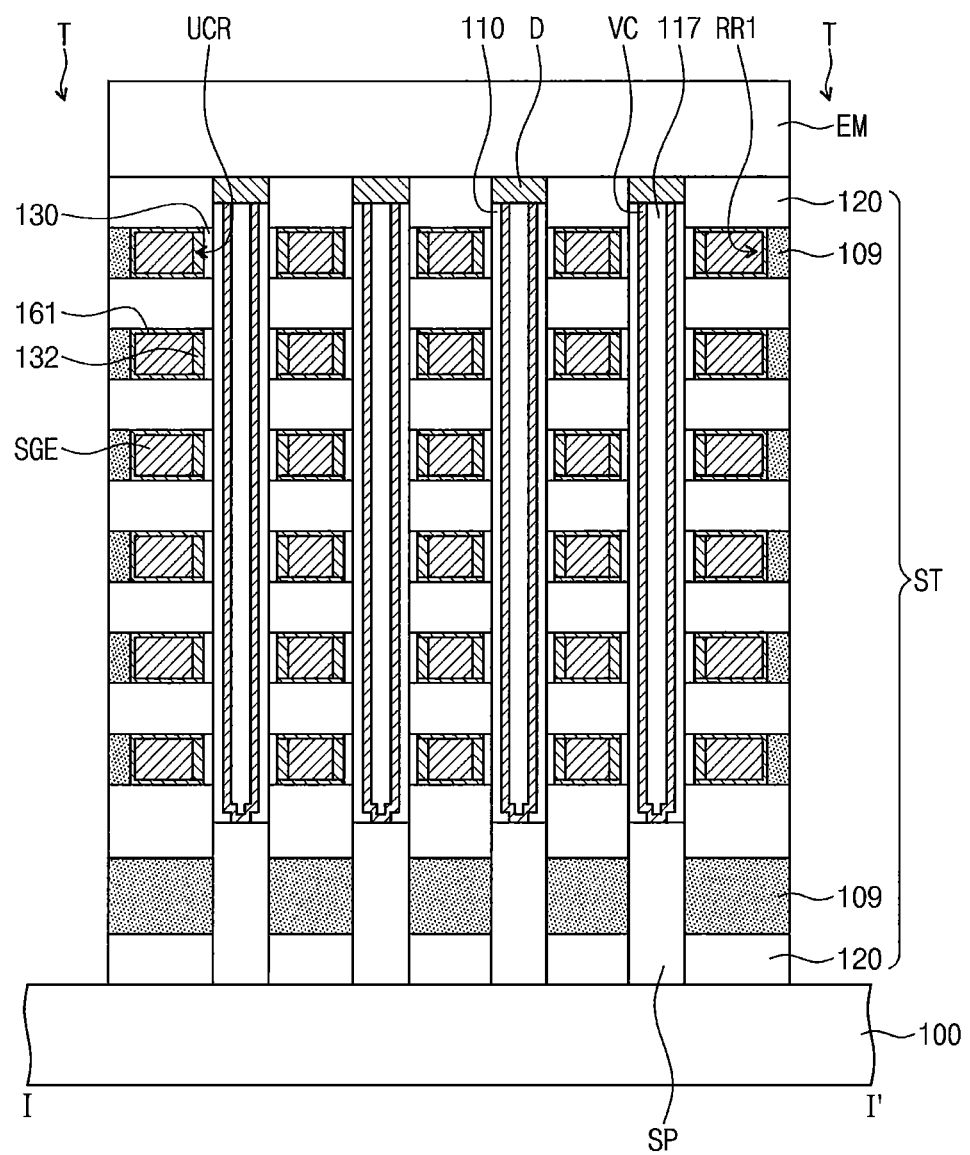

Referring to FIG. 26, a mask pattern EM may be formed on the mold structure MS. The mold structure MS may be anisotropically etched using the mask pattern EM as an etch mask to form trenches T. The anisotropic etching process may be performed until the top surface of the substrate 100 is exposed. The trenches T may extend in the second direction Y intersecting the first direction X illustrated in FIG. 2. The trenches T may have a linear or rectangular shape extending in the second direction Y. A plurality of stack structures ST spaced apart from each other in the first direction X may be formed on the substrate 100 by the formation of the trenches T.

Each of the stack structures ST may include insulating patterns 120 and gate electrodes SGE which are alternately stacked. In addition, each of the stack structures ST may include residual insulating patterns 109. The insulating patterns 120 may be formed by etching the insulating layers 102 using the mask pattern EM as the etch mask, and the residual insulating patterns 109 may be formed by etching the sacrificial layers 104 using the mask pattern EM as the etch mask. Sidewalls of the stack structure ST may be exposed through the trenches T.

Figure 27:
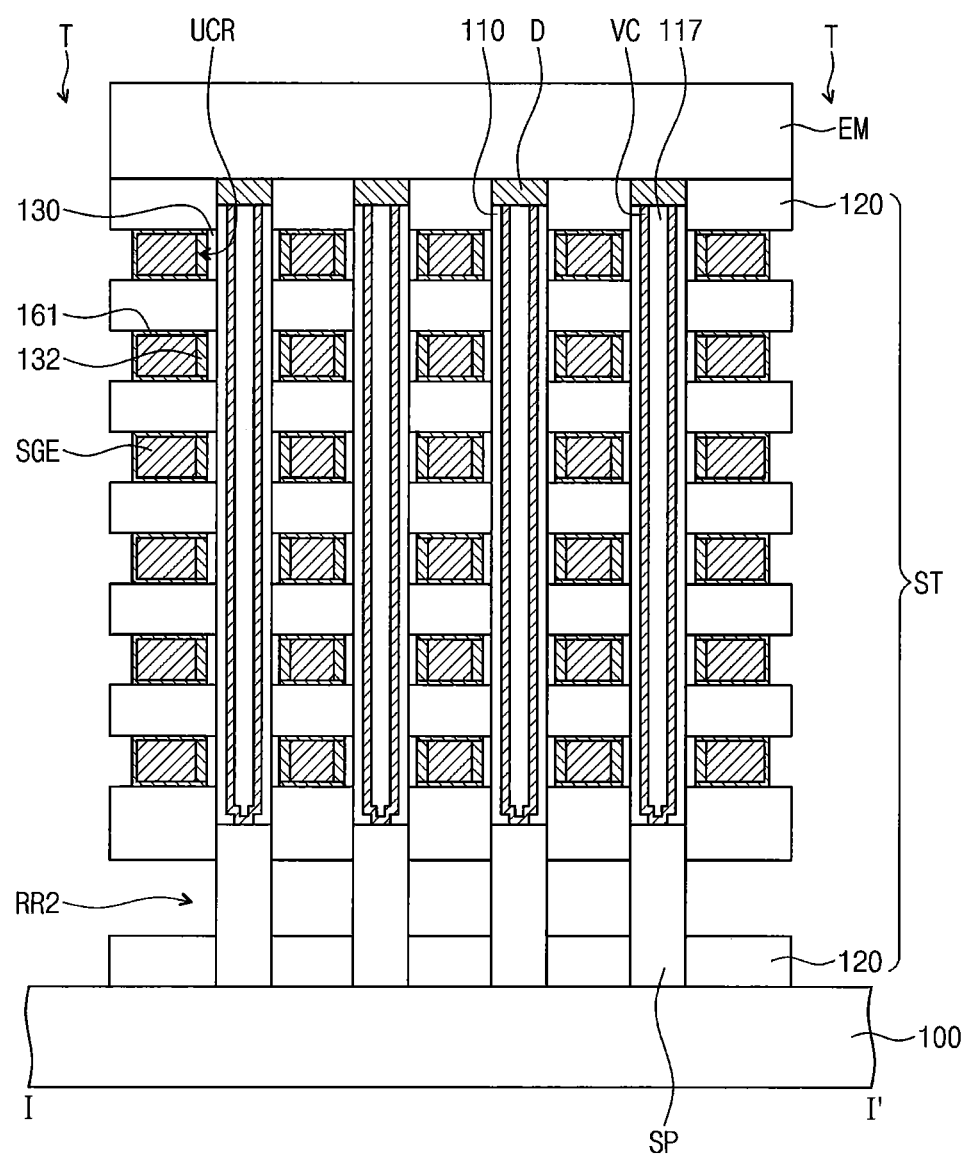

Referring to FIG. 27, the residual insulating patterns 109 exposed by the trenches T may be removed to form second recess regions RR2 of which each is disposed between the insulating patterns 120 vertically adjacent to each other. The second recess regions RR2 may be formed by removing the residual insulating patterns 109 using a wet etching process and/or an isotropic dry etching process. Since the residual insulating patterns 109 include the material having an etch selectivity with respect to the insulating patterns 120, the insulating patterns 120 may not be removed when the residual insulating patterns 109 are removed. For example, when the residual insulating patterns 109 include silicon nitride and the insulating patterns 120 include silicon oxide, the etching process may be performed using an etching solution including phosphoric acid.

Each of the second recess regions RR2 may laterally extend from the trench T into between the insulating patterns 120 vertically adjacent to each other. The lowermost second recess region RR2 formed by removing the lowermost residual insulating pattern 109 may expose a portion of the semiconductor pillar SP. The inner barrier patterns 161 may be exposed through the others of the second recess regions RR2 except the lowermost second recess region RR2.

Figure 28:
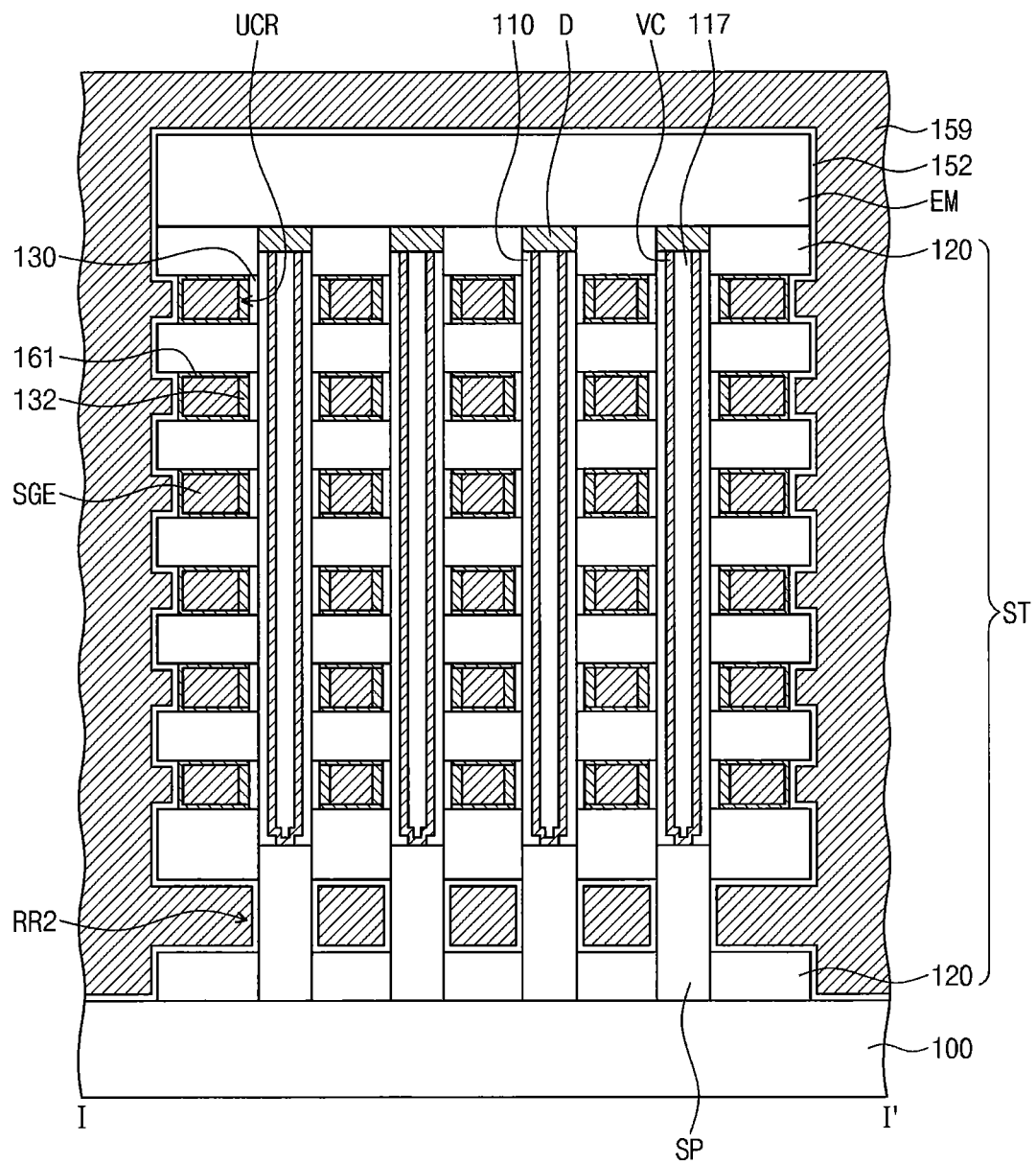

Referring to FIG. 28, an insulating layer 152 may be formed to cover inner surfaces of the trenches T and inner surfaces of the second recess regions RR2. In more detail, the insulating layer 152 may conformally cover top and bottom surfaces of the insulating patterns 120 exposed by the second recess regions RR2, the inner barrier patterns 161 exposed by the second recess regions RR2, the semiconductor pillars SP exposed by the lowermost second recess region RR2, sidewalls of the insulating patterns exposed by the trenches T, the top surface of the substrate 100 exposed by the trenches T, and a surface of the mask pattern EM. For example, the insulating layer 152 may include a silicon oxide layer.

A gate metal layer 159 may be formed on the substrate 100 having the trenches T and the second recess regions RR2. The gate metal layer 159 may cover the insulating layer 152 and may completely fill the second recess regions RR2. For example, the gate metal layer 159 may include a metal material (e.g., tungsten).

Figure 29:
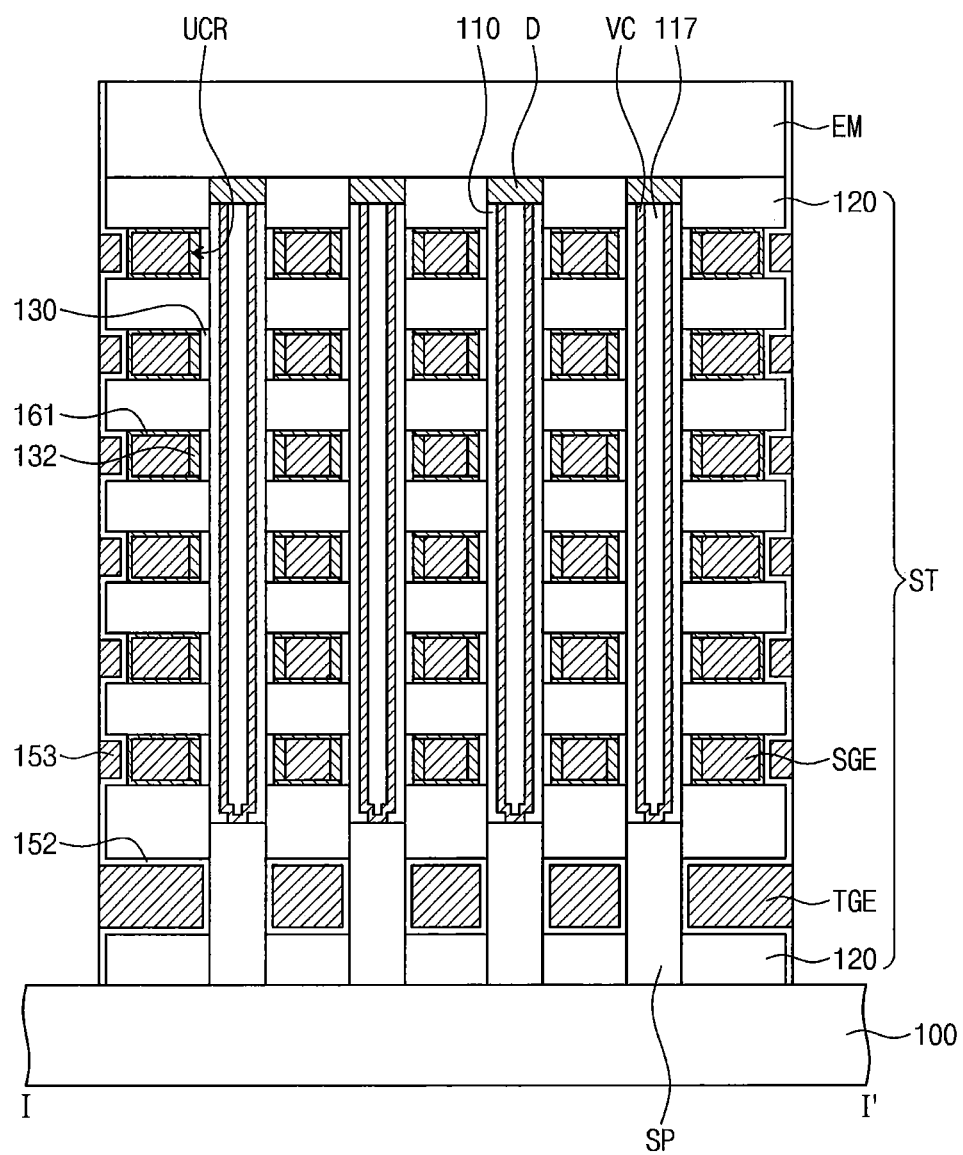

Referring to FIG. 29, the gate metal layer 159 disposed in the trenches T may be removed to expose a portion of the insulating layer 152, and the exposed portion of the insulating layer 152 may be removed to expose the top surface of the substrate 100. The removal process of the gate metal layer 159 may be performed using an isotropic etching process. By the removal process of the gate metal layer 159, a transistor gate electrode TGE of a selection transistor may be formed in the lowermost one of the second recess region RR2 and additional metal patterns 153 may be formed in the others of the second recess region RR2, respectively.

The transistor gate electrode TGE may cover the insulating layer 152 and may fill the lowermost second recess region RR2. The transistor gate electrode TGE may correspond to the first gate electrode GE1 illustrated in FIG. 3. The insulating layer 152 between the transistor gate electrode TGE and the semiconductor pillar SP may be used as a gate insulating layer of the transistor gate electrode TGE. The additional metal patterns 153 may cover the insulating layer 152 and may fill the others of the second recess regions RR2 except the lowermost second recess region RR2.

Figure 30:
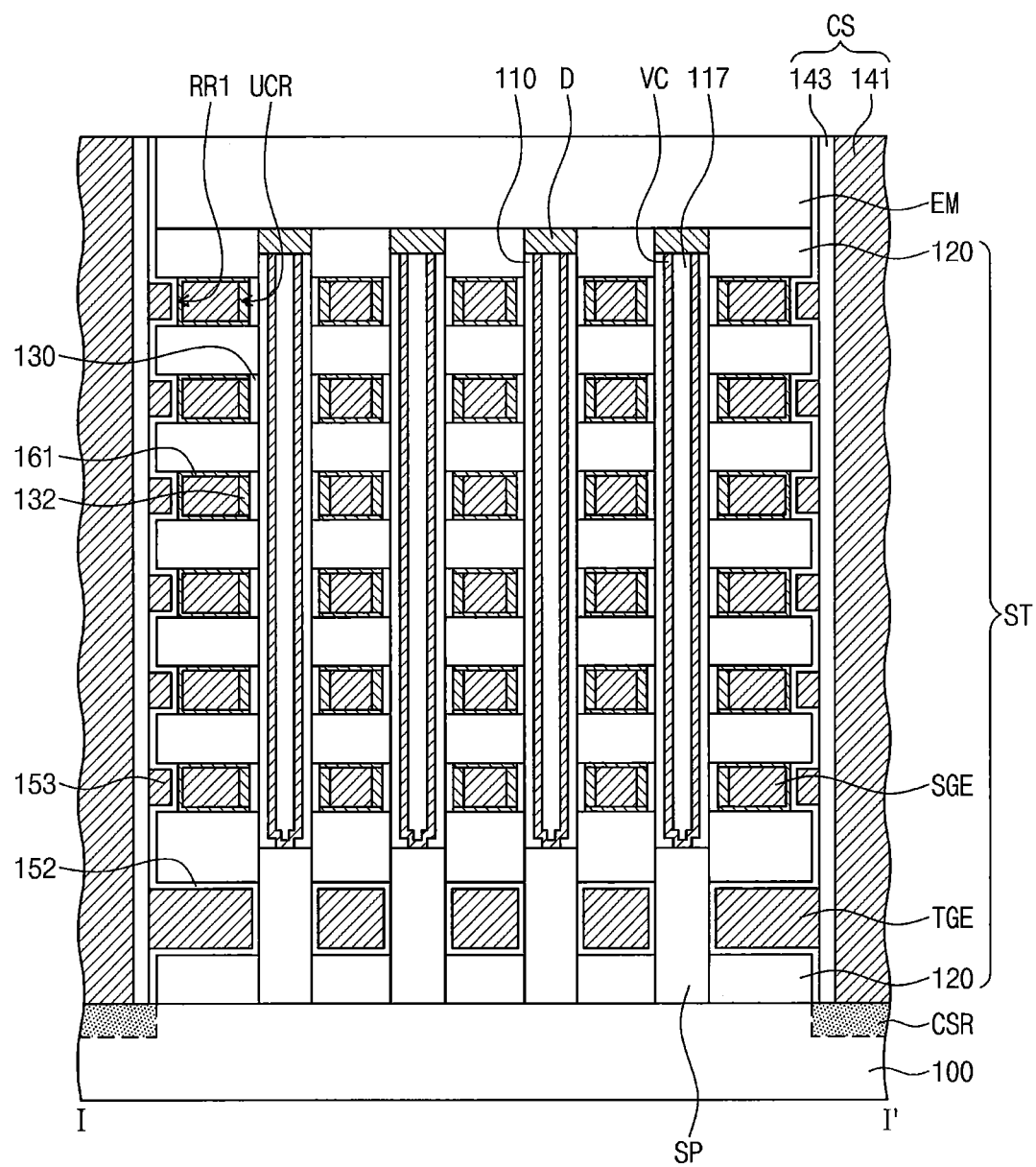

Referring to FIG. 30, a dopant region CSR may be formed in the substrate 100 under each of the trenches T. The dopant region CSR may be formed using an ion implantation process. The dopant region CSR may have a different conductivity type from the substrate 100.

A contact structure CS may be formed in each of the trenches T. The contact structure CS may include a spacer 143 and a common source contact 141. The spacer 143 may cover the sidewall of the trench T, and the common source contact 141 may fill the trench T. In some embodiments, a spacer insulating layer (not shown) may be formed to cover the sidewalls and a bottom surface of the trench T, and the spacer insulating layer (not shown) may be anisotropically etched until the substrate 100 is exposed, thereby forming the spacer 143. For example, the spacer 143 may be formed of silicon oxide and/or silicon nitride. The common source contact 141 may fill the trench T having the spacer 143. The common source contact 141 may be connected to the dopant region CSR. The common source contact 141 may be formed using, for example, a CVD process, a PVD process, or an ALD process. For example, the common source may be formed of at least one of a metal (e.g., tungsten, copper, or aluminum) or a transition metal (e.g., titanium or tantalum).

Referring to FIG. 3, the interlayer insulating layer 160 may be formed on the stack structure ST. The interlayer insulating layer 160 may cover top surfaces of the mask pattern EM, the spacers 143, and the common source contacts 141. For example, the interlayer insulating layer 160 may include an insulating material such as a silicon oxide layer, a silicon nitride layer, and/or a silicon oxynitride layer.

The interlayer insulating layer 160 and the mask pattern EM may be patterned to form holes, and contact plugs 162 may be formed in the holes, respectively. The contact plugs 162 may be electrically connected to the pads D, respectively. The contact plugs 162 may be formed of a conductive material including at least one of doped silicon or a metal material (e.g., tungsten (W), copper (Cu), or aluminum (Al)).

The bit lines BL connected to the contact plugs 162 may be formed on the interlayer insulating layer 160. As illustrated in FIG. 2, the bit lines BL may intersect the stack structure ST, and each of the bit lines BL may be connected to the vertical channel portions VC arranged in the first direction X. The bit lines BL may include a conductive material (e.g., tungsten).

Figure 31:
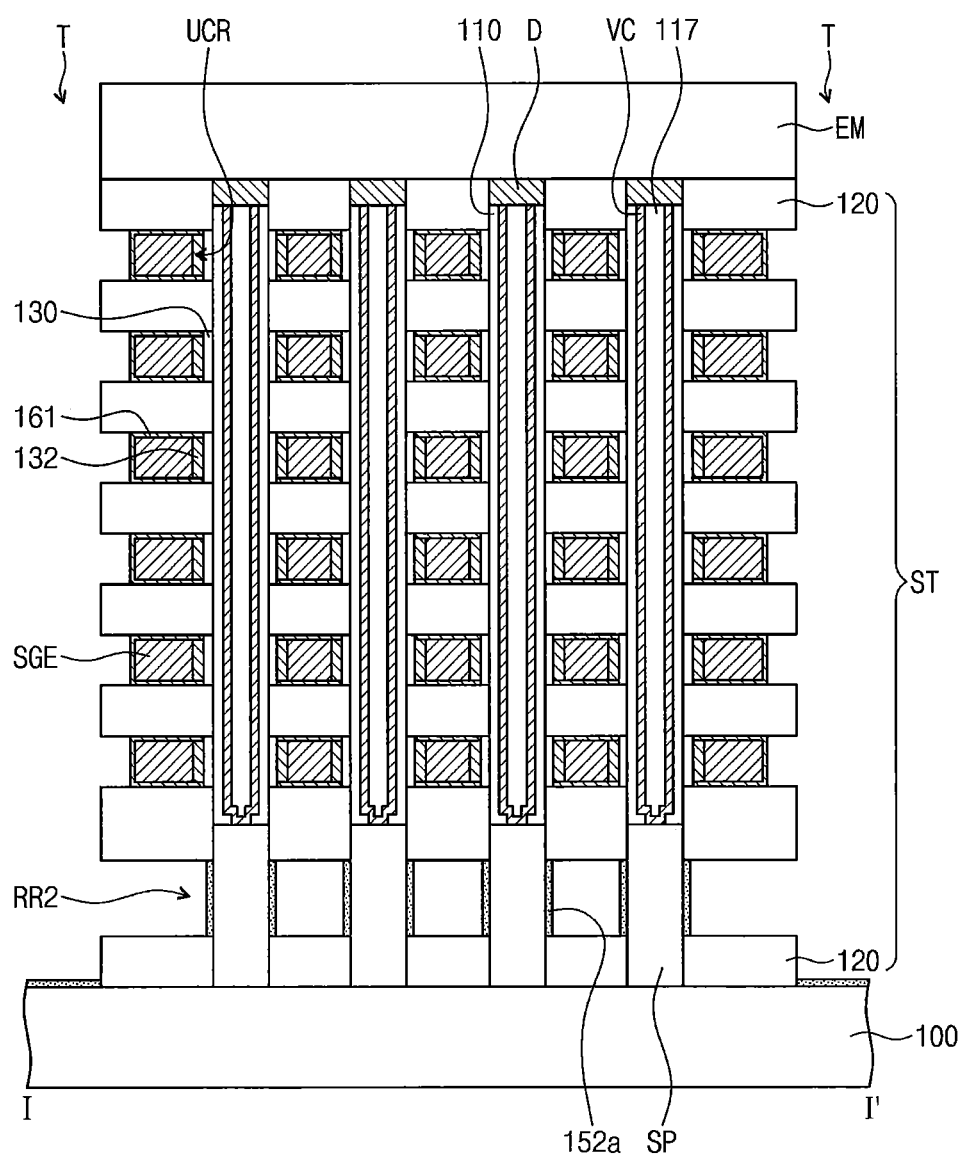
FIGS. 31 and 32 are cross-sectional views taken along the line I-I' of FIG. 2 to illustrate methods of manufacturing semiconductor memory devices according to some embodiments of the inventive concepts.
Figure 32:
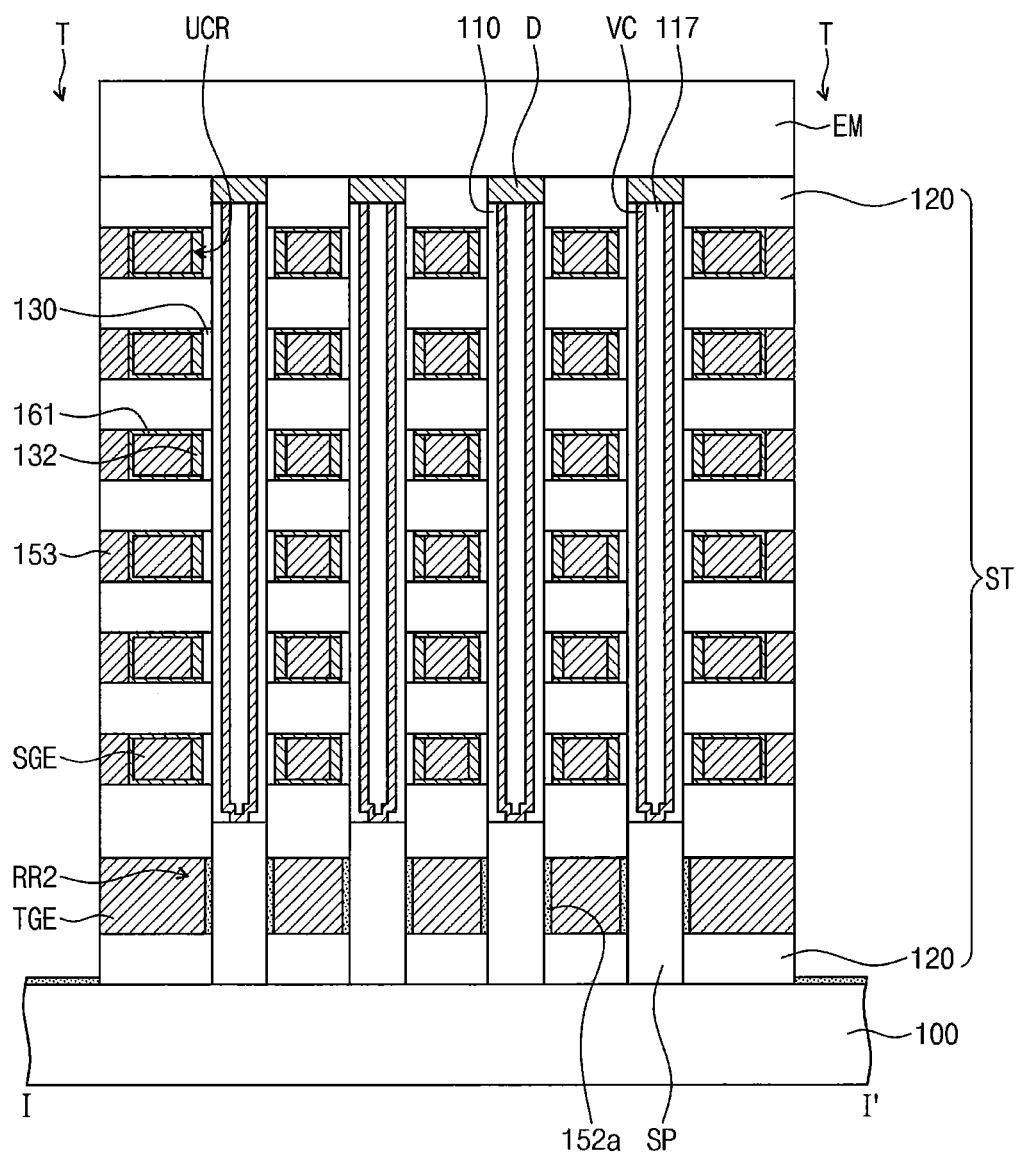

FIGS. 31 and 32 are cross-sectional views taken along the line I-I' of FIG. 2 to illustrate methods of manufacturing semiconductor memory devices according to some embodiments of the inventive concepts. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Referring to FIG. 31, the sidewalls of the semiconductor pillars SP exposed through the lowermost second recess region RR2 may be oxidized to form gate insulating layers 152a. The gate insulating layer 152a may be formed by, for example a thermal oxidation process. A thermal oxide layer may also be formed on the substrate 100 exposed on the trench T.

Referring to FIG. 32, the transistor gate electrode TGE may be formed in the lowermost second recess region RR2 by filling the lowermost second recess region RR2 with a conductive material. At this time, additional metal patterns 153 may be respectively formed in the others of the second recess regions RR2 except the lowermost second recess region RR2. The transistor gate electrode TGE may cover the gate insulating layer 152a, and the additional metal patterns 153 may cover the inner barrier patterns 161, respectively.

Referring again to FIG. 5, the dopant region CSR may be formed in the substrate 100 under the trench T, and the spacer 143 and the common source contact 141 may be sequentially formed in the trench T. The thermal oxide layer may be removed when the spacer insulating layer disposed on the top surface of the substrate 100 is removed to form the spacer 143.

The interlayer insulating layer 160, the contact plugs 162, and the bit lines BL may be sequentially formed on the stack structure ST.

FIGS. 33 to 41 are cross-sectional views taken along the line of FIG. 14 to illustrate methods of manufacturing semiconductor memory devices according to some embodiments of the inventive concepts. In the present embodiment, the same elements as described in the above embodiments will be indicated by the same reference numerals or the same reference designators, and the descriptions of the same elements as in the above embodiments will be omitted or mentioned briefly for the purpose of ease and convenience in explanation.

Figure 33:
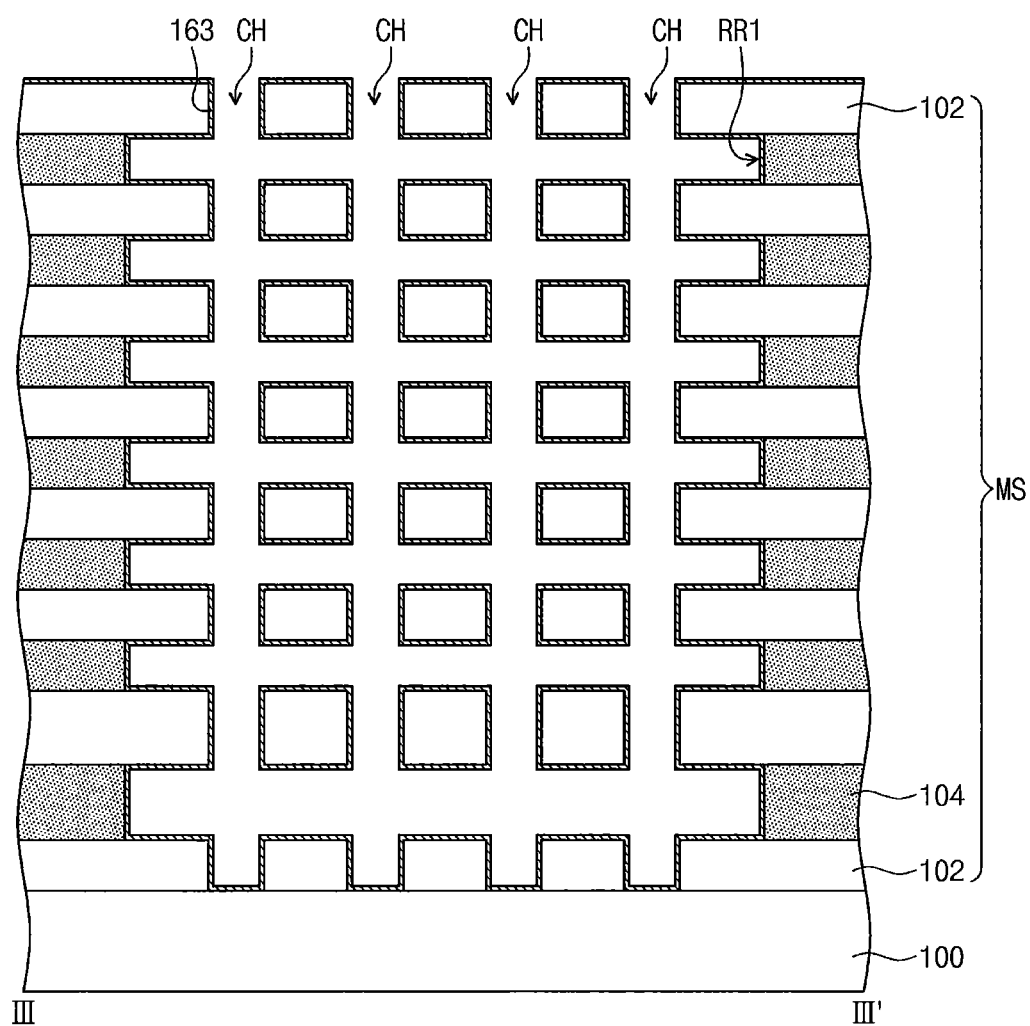
FIGS. 33 to 41 are cross-sectional views taken along the line of FIG. 14 to illustrate methods of manufacturing semiconductor memory devices according to some embodiments of the inventive concepts.

Referring to FIG. 33, the sacrificial layers 104 exposed by the channel holes CH may be etched, and thus portions of the sacrificial layers 104 may be removed and sidewalls of the sacrificial layers 104 may be laterally recessed from sidewalls of the insulating layers 102. The first recess regions RR1 may be formed in etched regions of the sacrificial layers 104. Each of the first recess regions RR1 may be defined by the insulating layers 102 vertically adjacent to each other and the recessed sidewall of each of the sacrificial layers 104. The first recess region RR1 may include the recess region formed between the channel holes CH.

In some embodiments, as illustrated in FIG. 33, the lowermost sacrificial layer 104 may also be etched when the semiconductor pillars SP are not formed in the channel holes CH. Thus, a sidewall of the lowermost sacrificial layer 104 may also be laterally recessed from the sidewalls of the insulating layers 102, and the first recess region RR1 may also be formed in an etched region of the lowermost sacrificial layer 104.

The first barrier layer 163 may be formed on surfaces of the insulating layers 102, surfaces of the sacrificial layers 104, and the top surface of the substrate 100, which are exposed by the channel holes CH and the first recess regions RR1. In more detail, the first barrier layers 163 may conformally cover the sidewalls of the sacrificial layers 104, top and bottom surfaces and sidewalls of the insulating layers 102, and the top surface of the substrate 100.

Figure 34:
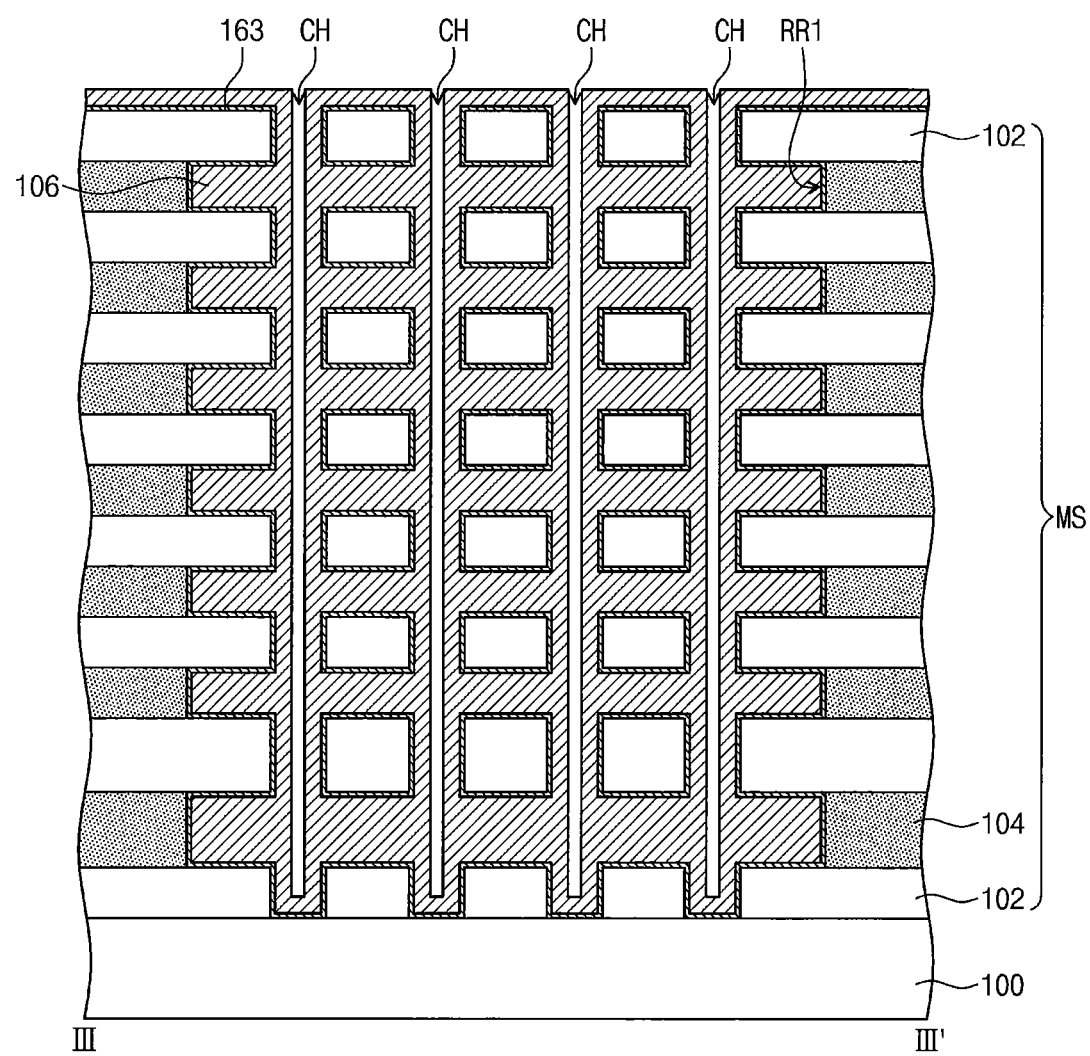

Referring to FIG. 34, the metal layer 106 may be formed in the channel holes CH. The metal layer 106 may cover a surface of the first barrier layer 163 and may completely fill the first recess regions RR1.

Figure 35:
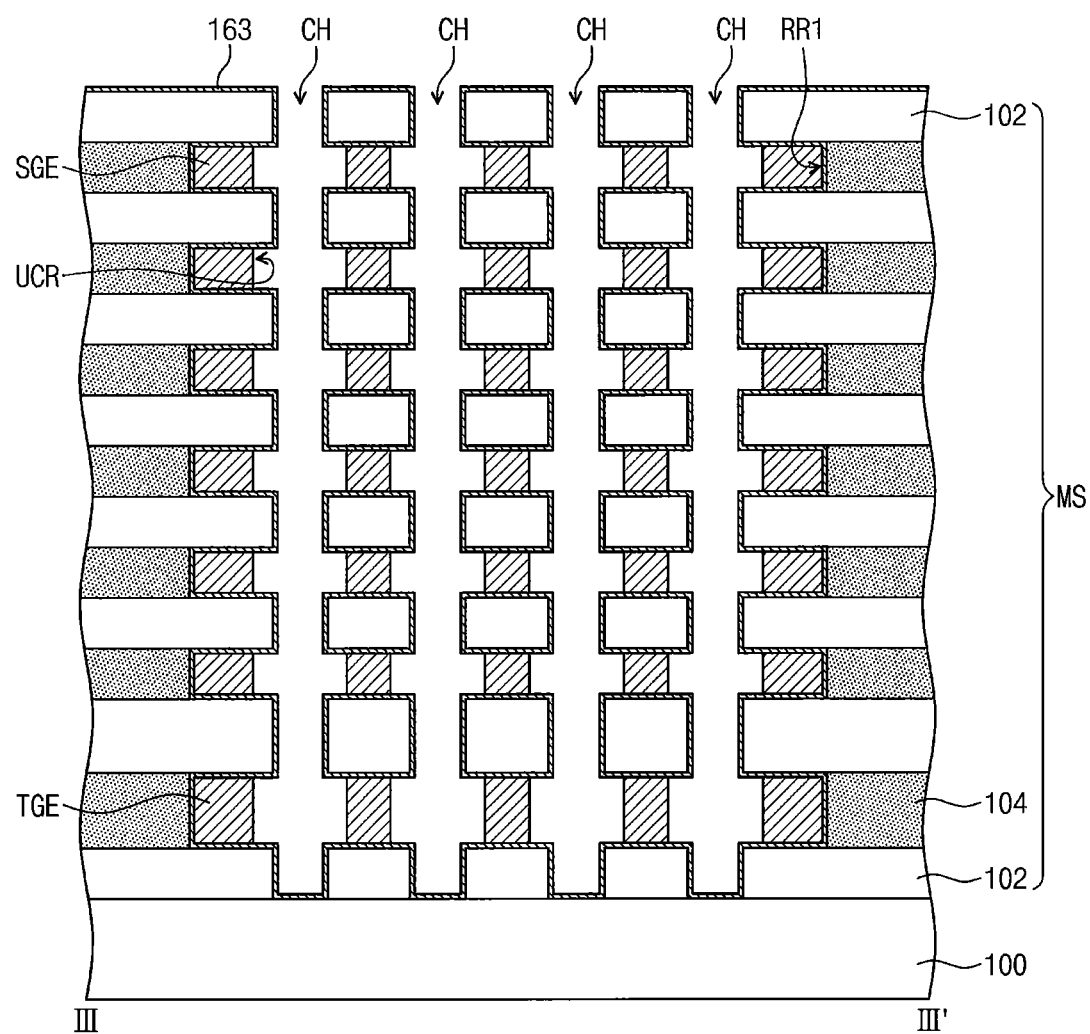

Referring to FIG. 35, the trimming process may be performed on the metal layer 106 to form a transistor gate electrode TGE and the gate electrodes SGE. During the trimming process, the metal layer 106 disposed outside the first recess regions RR1 may be removed to locally leave portions of the metal layer 106 in the first recess regions RR1, respectively. The first barrier layer 163 disposed on sidewalls of the insulating layers 102, the substrate 100, and the top surface of the uppermost insulating layer 102 may be exposed by the trimming process. The trimming process may include a wet etching process or a dry etching process.

The transistor gate electrode TGE may be formed in the lowermost one of the first recess regions RR1, and the gate electrodes SGE may be respectively formed in the others of the first recess regions RR1 except the lowermost first recess region RR1. The transistor gate electrode TGE may correspond to the first gate electrode GE1 of FIG. 15, and the gate electrodes SGE may correspond to the second gate electrodes GE2 of FIG. 15.

The transistor gate electrode TGE and the gate electrodes SGE exposed by the channel holes CH may be etched, and thus sidewalls of the transistor gate electrode TGE and the gate electrodes SEG may be laterally recessed from the sidewalls of the insulating layers 102. The sidewalls of the transistor gate electrode TGE and the gate electrodes SEG may be laterally recessed to form undercut regions UCR of which each is formed between the insulating layers 102 vertically adjacent to each other. The lowermost undercut region UCR may be defined by the sidewall of the transistor gate electrode TGE and the first barrier layer 163 covering a bottom surface of the insulating layer 102 on the transistor gate electrode TGE and a top surface of the insulating layer 102 under the transistor gate electrode TGE. Each of the others of the undercut regions UCR except the lowermost undercut region may be defined by the sidewall of each of the gate electrodes SGE and the first barrier layer 163 covering a bottom surface of the insulating layer 102 on each gate electrode SGE and a top surface of the insulating layer 102 under each gate electrode SGE.

Figure 36:
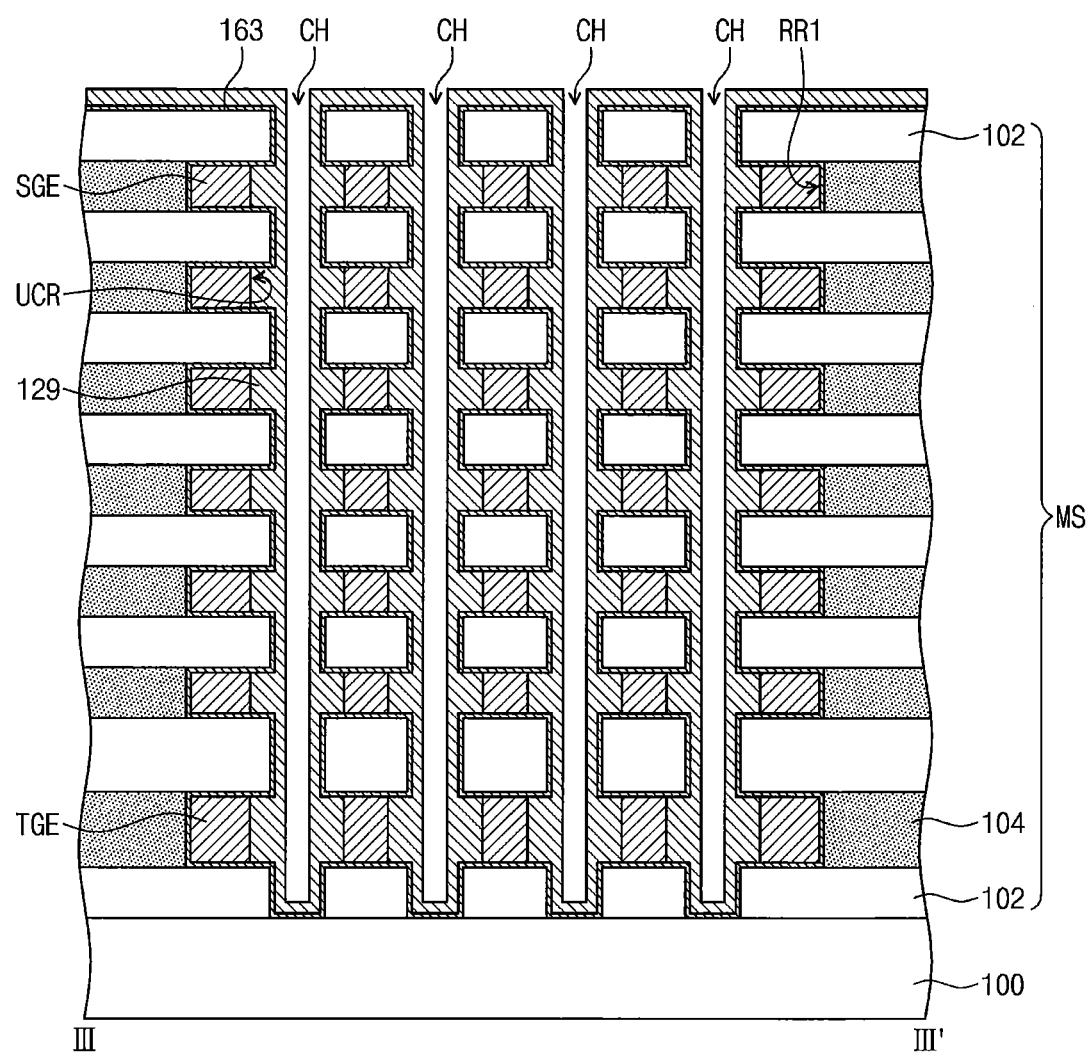

Referring to FIG. 36, the second barrier layer 129 may be formed in the channel holes CH. The second barrier layer 129 may be formed to cover the first barrier layer 163, the sidewalls of the gate electrodes SGE, and the sidewall of the transistor gate electrode TGE. The second barrier layer 129 may completely fill the undercut regions UCR.

Figure 37:
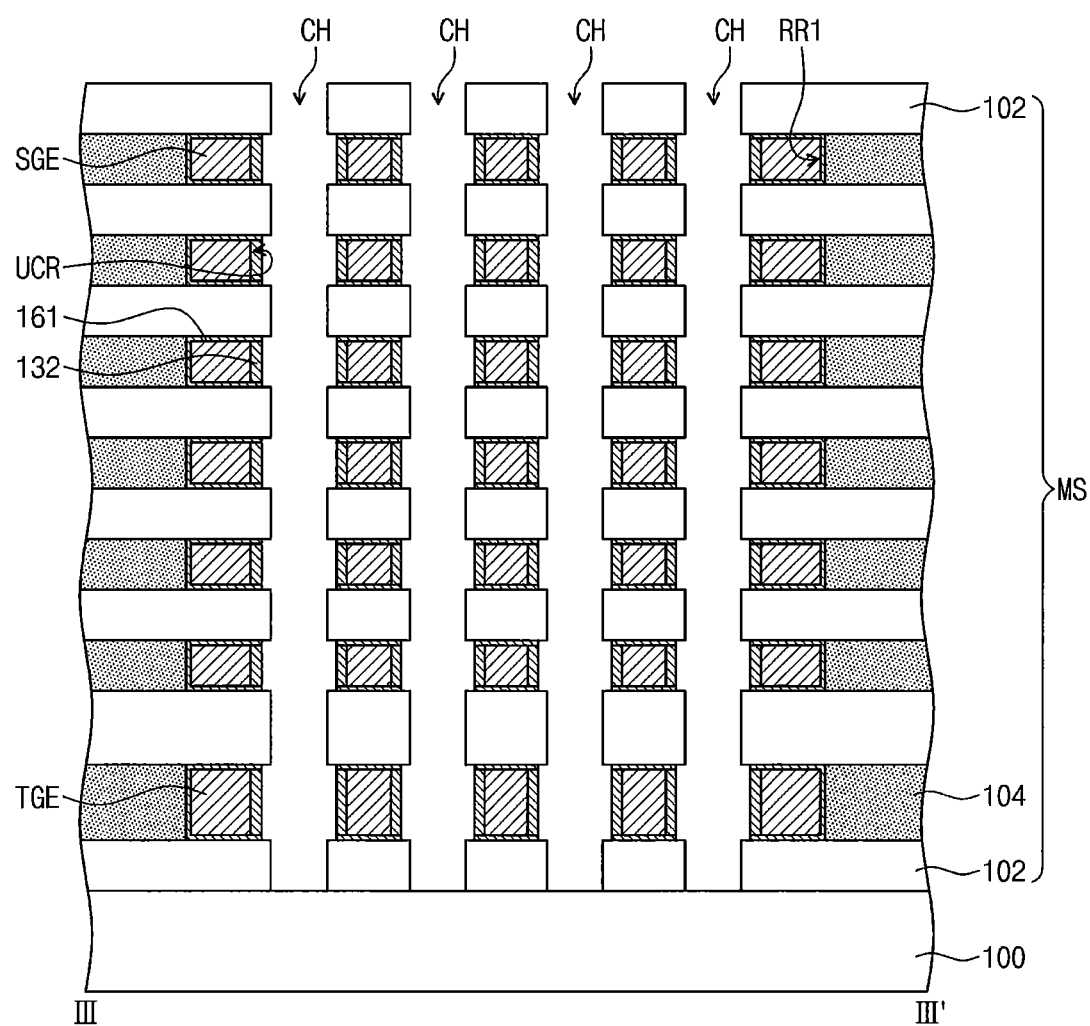

Referring to FIG. 37, the second barrier layer 129 and the first barrier layer 163 may be etched to form the inner barrier patterns 161 and the outer barrier patterns 132. Thus, the first and second barrier layers 163 and 129 in the channel holes CH may be removed to expose the sidewalls of the insulating layers 102 and the top surface of the substrate 100. Each of the inner barrier patterns 161 may be locally formed in each of the first recess regions RR1, and each of the outer barrier patterns 132 may be locally formed in each of the undercut regions UCR.

Figure 38:
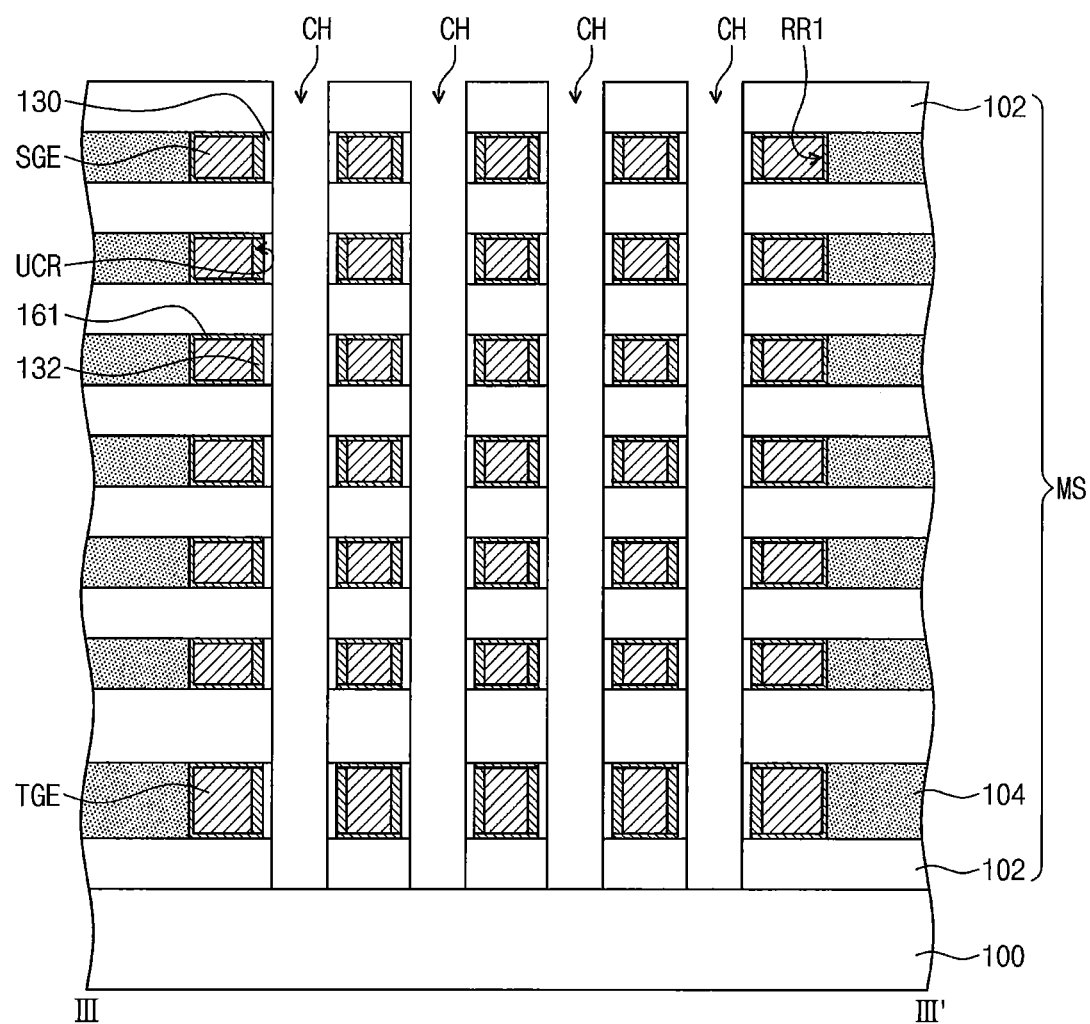

Referring to FIG. 38, the blocking patterns 130 may be formed in the undercut regions UCR, respectively. The blocking patterns 130 may be vertically spaced apart from each other. Each of the blocking patterns 130 may cover the sidewall of the outer barrier pattern 132 and top and bottom surfaces of the insulating layers 102 exposed by the undercut region UCR.

Figure 39:
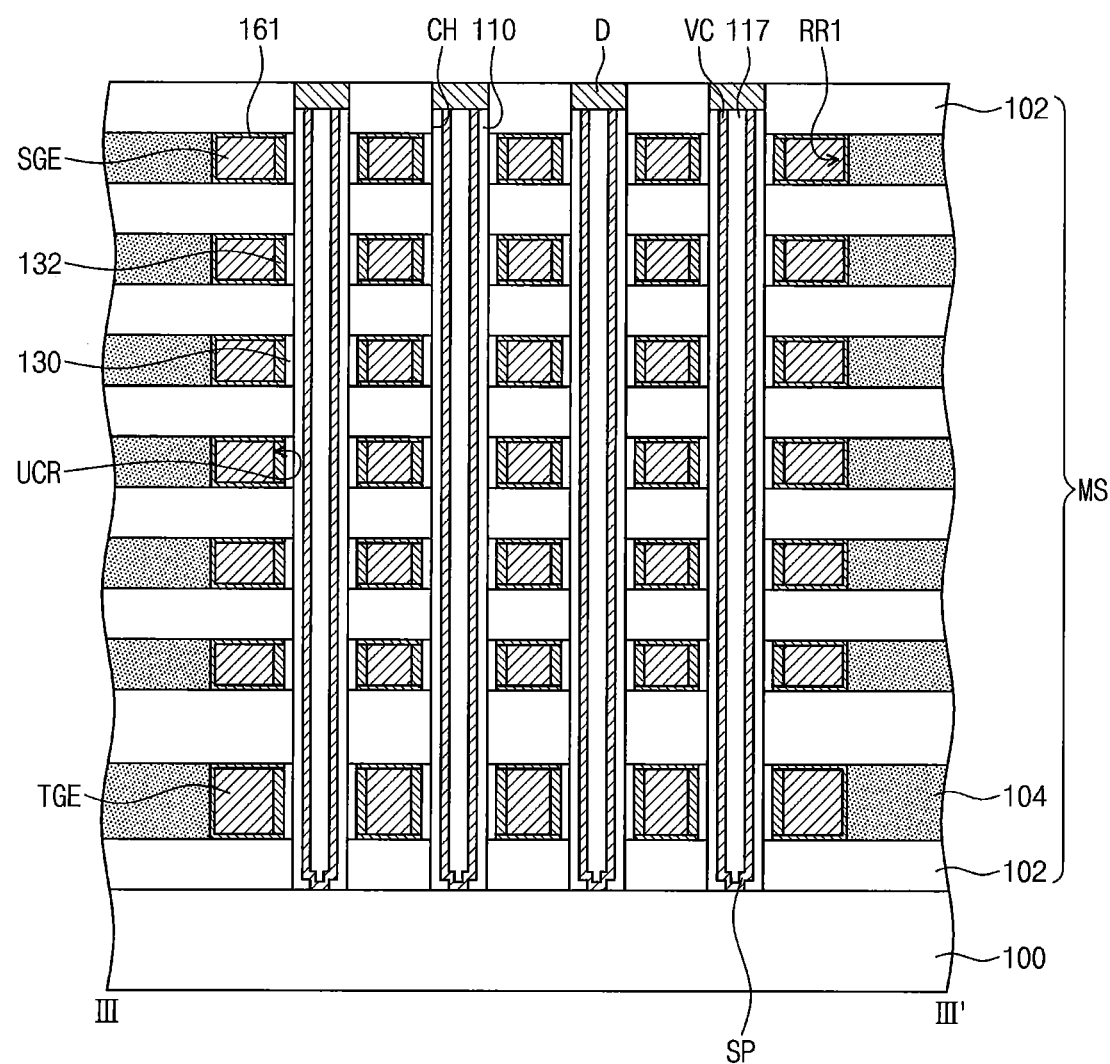

Referring to FIG. 39, the charge storage structure 110, the vertical channel portion VC, and the capping layer 117 may be formed in each of the channel holes CH. The charge storage structure 110 may conformally cover the sidewalls of the insulating layers 102, the sidewalls of the blocking patterns 130, and a portion of the top surface of the substrate 100 under the channel hole CH. The vertical channel portion VC may conformally cover an inner sidewall of the charge storage structure 110 and the top surface of the substrate 100 exposed by the charge storage structure 110. The capping layer 117 may fill the inner space of the charge storage structure 110.

The pad D may be formed on the charge storage structure 110, the vertical channel portion VC, and the capping layer 117 which are disposed in each of the channel holes CH. The pad P may be electrically connected to the vertical channel portions VC, respectively.

Figure 40:
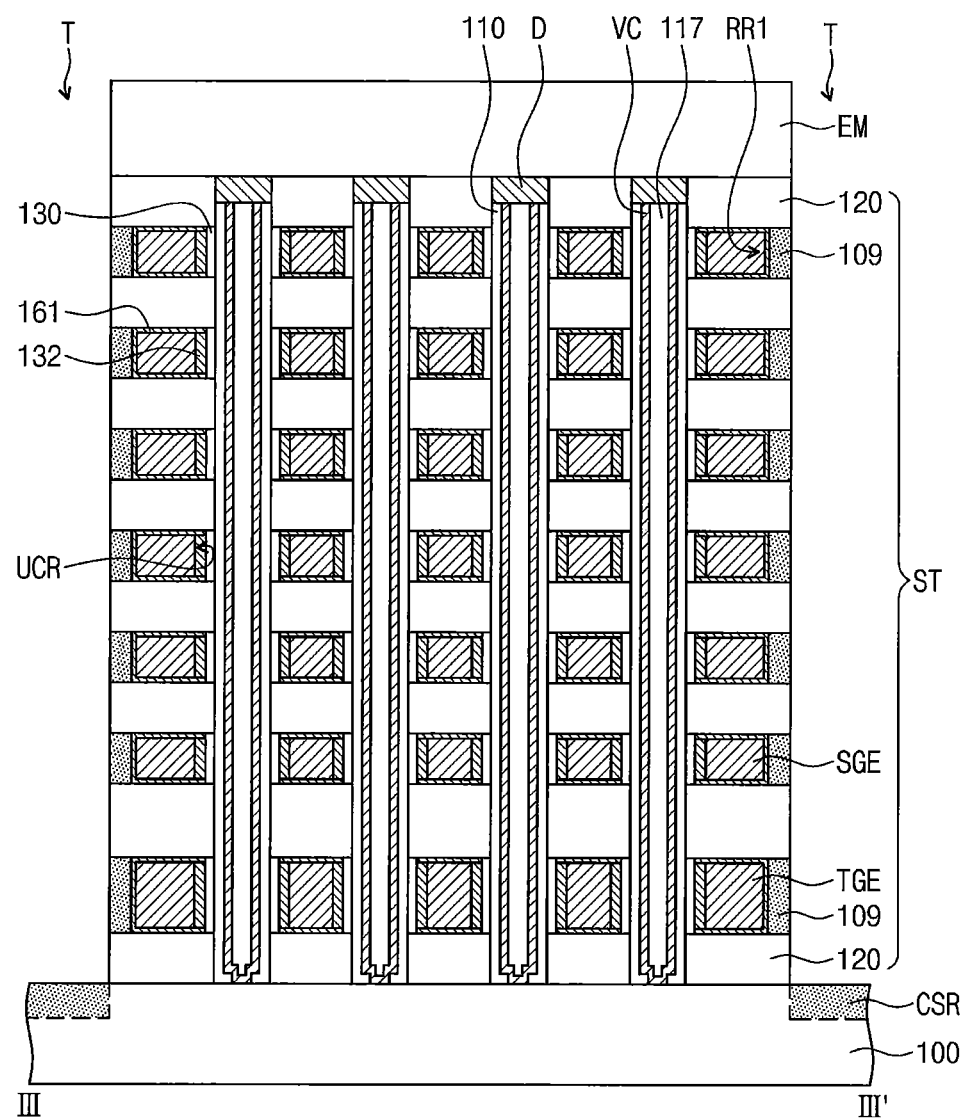

Referring to FIG. 40, the mask pattern EM may be formed on the mold structure MS, and the mold structure MS may be anisotropically etched using the mask pattern EM as an etch mask to form the trenches T and the stack structure ST between the trenches T. The top surface of the substrate 100 and the sidewalls of the stack structure ST may be exposed by the trenches T.

The stack structure ST may include the insulating patterns 120, the residual insulating patterns 109, the transistor gate electrode TGE, and the gate electrodes SGE. The sidewall of the stack structure St may include sidewalls of the insulating patterns 120 and sidewalls of the residual insulating patterns 109.

The dopant region CSR may be formed in the substrate 100 under each of the trenches T.

Figure 41:
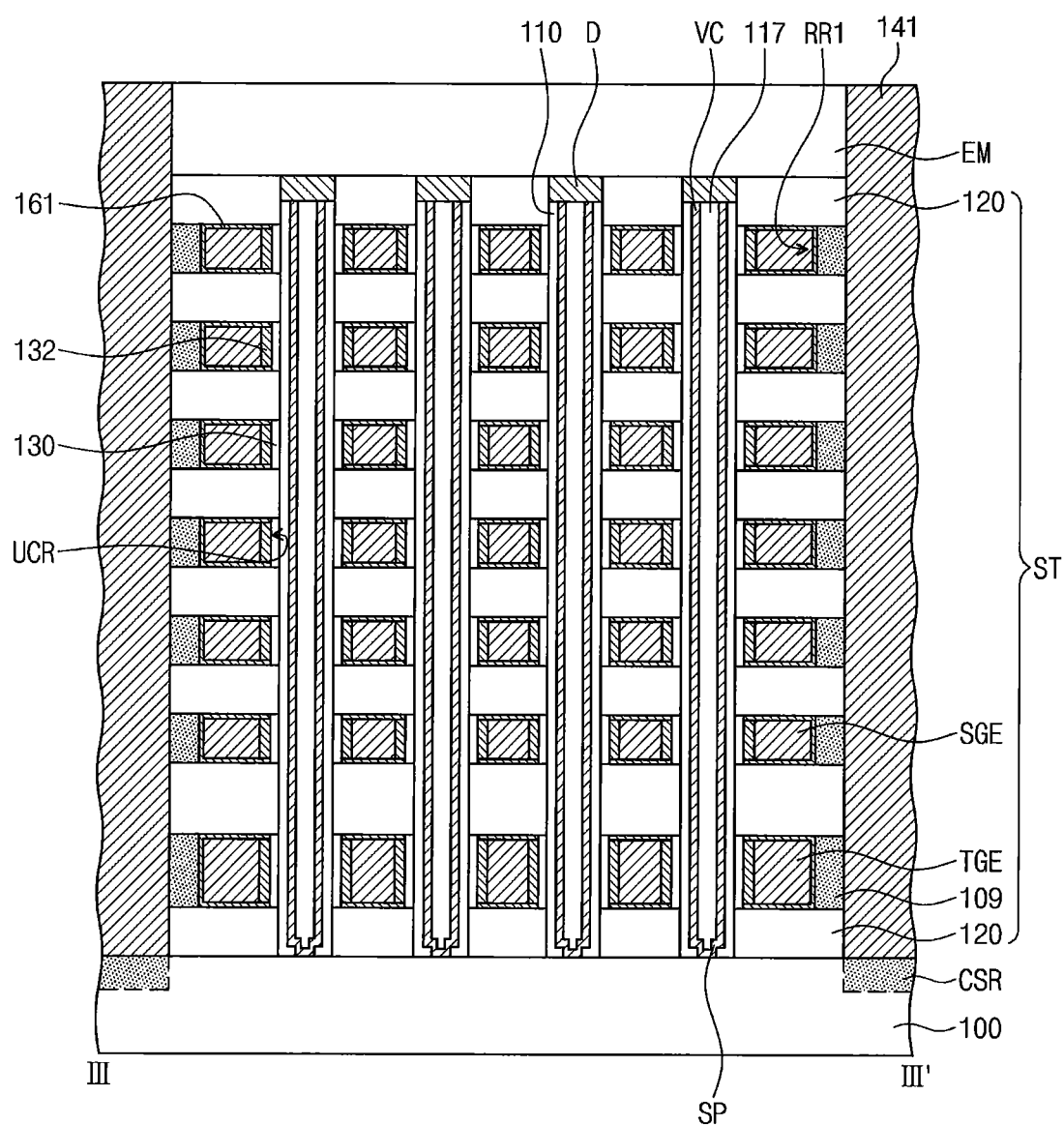

Referring to FIG. 41, the common source contact 141 may be formed in each of the trenches T. The common source contact 141 may be connected to the dopant region CSR and may be in contact with the sidewall of the stack structure ST. The common source contact 141 may be electrically insulated from the transistor gate electrode TGE and the gate electrodes SGE by the residual insulating patterns 109.

Referring again to FIGS. 14 and 15, the interlayer insulating layer 160 may be formed on the stack structure ST. The interlayer insulating layer 160 may cover the top surfaces of the mask pattern EM and the common source contact 141.

The contact plugs 162 may be formed to penetrate the interlayer insulating layer 160 and the mask pattern EM. The contact plugs 162 may be electrically connected to the pads D, respectively. The bit lines BL connected to the contact plugs 162 may be formed on the interlayer insulating layer 160.

According to some embodiments of the inventive concepts, the sacrificial layers exposed by the channel holes may be etched to form the recess regions of which each is disposed between the insulating layers vertically adjacent to each other, and the gate electrodes may be formed by filling the recess regions with a metal material through the channel holes. The distance between the channel holes may be smaller than a distance between the trenches defining the stack structure, and thus, the lateral aspect ratio of the recess region between the channel holes may be smaller than that of a lateral space between the trenches. As a result, the gate electrodes may be formed in the recess regions without a void, thereby improving the reliability of the semiconductor memory device. In some embodiments, the formation of portions of the gate electrodes in the recess regions with the smaller aspect ratio via the channel holes may result in the formation of gate electrodes without, or with fewer, voids as compared to a process which fully forms the gate electrodes using trenches adjacent the stacked insulation layers.

While the inventive concepts have been described with reference to example embodiments, it will be apparent to those skilled in the art that various changes and modifications may be made without departing from the spirits and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor memory device comprising:
a substrate;
insulating patterns and gate patterns alternately stacked on the substrate;
a channel structure that intersects the insulating patterns and the gate patterns and that is connected to the substrate;
a charge storage structure that is between the channel structure and the gate patterns; and
a contact structure that is on the substrate at a side of the insulating patterns and the gate patterns,
wherein at least one of the gate patterns comprises:
a first barrier pattern that is between a first insulating pattern of the insulating patterns and a second insulating pattern of the insulating patterns that is adjacent the first insulating pattern in a first direction perpendicular to a main surface of the substrate, the first barrier pattern defining a concave region that is between a first portion of the first barrier pattern that extends along the first insulating pattern, a second portion of the first barrier pattern that extends along the second insulating pattern, and a third portion of the first barrier pattern that extends between the first portion and the second portion; and
a metal pattern that is in the concave region defined by the first barrier pattern and is between the third portion of the first barrier pattern and the charge storage structure.

2. The semiconductor memory device of claim 1, wherein the at least one of the gate patterns further comprises:
a second barrier pattern that is in the concave region defined by the first barrier pattern,
wherein the second barrier pattern is between the metal pattern and the charge storage structure.

3. The semiconductor memory device of claim 1, further comprising:
blocking patterns between the charge storage structure and respective ones of the metal patterns,
wherein the blocking patterns are spaced apart from each other by the insulating patterns in the first direction.

4. The semiconductor memory device of claim 3, wherein the blocking patterns surround a portion of an outer sidewall of the charge storage structure.

5. The semiconductor memory device of claim 3, wherein a first thickness of a respective one of the metal patterns in the first direction is smaller than a second thickness of a respective one of the blocking patterns in the first direction.

6. The semiconductor memory device of claim 1, further comprising:
an insulating layer that is between the charge storage structure and the gate patterns,
wherein the insulating layer extends in the first direction.

7. The semiconductor memory device of claim 1, wherein a sidewall of the metal pattern is laterally recessed from a sidewall of the first insulating pattern and a sidewall of the second insulating pattern to define an undercut region,
wherein the charge storage structure extends in the first direction, has a first segment between the channel structure and the metal pattern, and has second segments between the channel structure and the insulating patterns, and
wherein a portion of the first segment of the charge storage structure is in the undercut region.

8. The semiconductor memory device of claim 7, wherein the channel structure comprises a portion that protrudes toward the metal pattern.

9. The semiconductor memory device of claim 1, wherein the metal pattern comprises a first metal pattern, and the semiconductor memory device further comprises:
- second metal patterns that are between the contact structure and respective first barrier patterns of the gate patterns, the second metal patterns spaced apart from each other in the first direction with one of the insulating patterns interposed between adjacent second metal patterns; and
- an insulating layer that is between the first barrier patterns of the gate patterns and the second metal patterns, the insulating layer extending onto a top surface and a bottom surface of respective ones of the second metal patterns.

10. The semiconductor memory device of claim 1, further comprising:
- residual insulating patterns between the contact structure and respective first barrier patterns of the gate patterns, the residual insulating patterns spaced apart from each other in the first direction with one of the insulating patterns interposed between adjacent residual insulating patterns.

11. The semiconductor memory device of claim 10, wherein a sidewall of at least one of the insulating patterns is in contact with the contact structure, and
wherein a sidewall of at least one of the residual insulating patterns is in contact with the contact structure.

12. The semiconductor memory device of claim 1, wherein the metal pattern comprises a first metal pattern, and wherein the at least one of the gate patterns further comprises:
- a second metal pattern that is between the first barrier pattern and the contact structure,
- wherein one of the insulating patterns is interposed between adjacent ones of the second metal patterns.

13. A semiconductor memory device comprising:
- a substrate;
- a first gate pattern on the substrate;
- second gate patterns that are sequentially stacked on the first gate pattern;
- a semiconductor structure that is on the substrate, the semiconductor structure intersecting the first gate pattern;
- a channel structure intersecting the second gate patterns and connected to the semiconductor structure;
- a charge storage structure that is between the channel structure and the second gate patterns;
- metal patterns on sidewalls of the second gate patterns, wherein the metal patterns are spaced apart from each other in a first direction perpendicular to a top surface of the substrate; and
- an insulating layer that is between the second gate patterns and the metal patterns, the insulating layer extending onto a top surface and a bottom surface of respective ones of the metal patterns.

14. The semiconductor memory device of claim 13, further comprising:
- barrier patterns between the charge storage structure and the second gate patterns, wherein respective ones of the barrier patterns are spaced apart from each other in the first direction; and
- blocking patterns between the charge storage structure and the barrier patterns, wherein respective ones of the blocking patterns are spaced apart from each other in the first direction.

15. The semiconductor memory device of claim 13, further comprising:
- barrier patterns between the insulating layer and respective ones of the second gate patterns, wherein respective ones of the barrier patterns extend onto a top surface and a bottom surface of respective ones of the second gate patterns.

16. A semiconductor memory device comprising:
- a substrate;
- a charge storage structure that is on the substrate and that extends in a first direction perpendicular to a main surface of the substrate;
- a contact structure that is on the substrate and that extends in the first direction;
- a plurality of insulating patterns that are stacked on the substrate in the first direction and that are between the charge storage structure and the contact structure in a second direction parallel to the main surface of the substrate;
- a gate pattern that is on the substrate and that is between a first insulating pattern and a second insulating pattern of the plurality of insulating patterns that are adjacent one another in the first direction; and
- a blocking pattern that is on the substrate and between the first insulating pattern and the second insulating pattern in the first direction, and that is between the gate pattern and the charge storage structure in the second direction,
wherein the gate pattern comprises:
- a first metal pattern; and
- an outer barrier pattern that is between the first metal pattern and the blocking pattern in the second direction,
wherein a first thickness of the first metal pattern in the first direction is substantially equal to a second thickness of the outer barrier pattern in the first direction,
wherein the contact structure is at a side of the first and second insulating patterns and the gate pattern, and
wherein the gate pattern further comprises an inner barrier pattern comprising a first portion that is between the first metal pattern and the first insulating pattern, a second portion that is between the first metal pattern and the second insulating pattern, and a third portion that is between the first metal pattern and the contact structure.

17. The semiconductor memory device of claim 16, further comprising a residual insulating pattern between the third portion of the inner barrier pattern and the contact structure in the second direction.

18. The semiconductor memory device of claim 16, further comprising:
- a second metal pattern that is between the inner barrier pattern and the contact structure in the second direction; and
- an insulating layer between the inner barrier pattern and the second metal pattern in the second direction.

19. The semiconductor memory device of claim 18, wherein the contact structure comprises:
- a metal common source contact that extends in the first direction and contacts a doped portion of the substrate; and
- a spacer comprising an insulating material that extends in the first direction and contacts the second metal pattern.

* * * * *